(12) United States Patent
Oh et al.

(10) Patent No.: US 7,402,493 B2
(45) Date of Patent: Jul. 22, 2008

(54) METHOD FOR FORMING NON-VOLATILE MEMORY DEVICES

(75) Inventors: Chang-Woo Oh, Suwon-si (KR); Dong-Gun Park, Seongnam-si (KR); Dong-Won Kim, Seongnam-si (KR); Yong-Kyu Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/602,032

(22) Filed: Nov. 20, 2006

(65) Prior Publication Data
US 2007/0063263 A1    Mar. 22, 2007

Related U.S. Application Data

(62) Division of application No. 11/007,760, filed on Dec. 8, 2004, now Pat. No. 7,161,206.

(30) Foreign Application Priority Data
Apr. 12, 2004    (KR) ............................... 2004-25095

(51) Int. Cl.
*H01L 21/336*    (2006.01)

(52) U.S. Cl. .................. 438/257; 438/258; 438/593; 438/E21.442; 438/E29.137; 257/315; 257/314

(58) Field of Classification Search ......... 438/257–258, 438/593; 257/314–315
See application file for complete search history.

(56) References Cited

U.S. PATENT DOCUMENTS 6,657,252 B2 * 12/2003 Fried et al. .................. 257/316

FOREIGN PATENT DOCUMENTS

| KR | 2003-0020644 | 3/2003 |
|---|---|---|
| KR | 2003-0065864 | 8/2003 |
| KR | 10-0420070 | 2/2004 |

* cited by examiner

*Primary Examiner*—Dung A. Le
(74) *Attorney, Agent, or Firm*—Mills Onello LLP

(57) ABSTRACT

According to a nonvolatile memory device having a multi gate structure and a method for forming the same of the present invention, a gate electrode is formed using a damascene process. Therefore, a charge storage layer, a tunneling insulating layer, a blocking insulating layer and a gate electrode layer are not attacked from etching in a process for forming the gate electrode, thereby forming a nonvolatile memory device having good reliability.

23 Claims, 35 Drawing Sheets

METHOD FOR FORMING NON-VOLATILE MEMORY DEVICES

CROSS REFERENCE TO RELATED APPLICATIONS

This application is a divisional of U.S. application Ser. No. 11/007,760, filed on Dec. 8, 2004, now U.S. Pat. No. 7,161,206, which relies for priority upon Korean Patent Application No. 10-2004-0025095, filed on Apr. 12, 2004, the contents of which are herein incorporated by reference in their entirety.

BACKGROUND OF THE INVENTION

The present invention relates to memory devices and methods for forming the same, and more specifically to non-volatile memory devices and methods for forming the same.

The flash memory device is an electrically programmable non-volatile memory device capable of programming in units of pages or multi-bits and erasing in units of blocks or sectors, thereby having excellent characteristics in respect of speed. The flash memory may be used in various devices such as a digital cellular phone, a digital camera, a LAN-switch, a PC card of a notebook computer, a digital set-top box, a built-in controller, etc.

As well known, the flash memory device comprises a source/drain, a tunneling oxide layer, a floating gate, a block insulating layer and a control gate. When a proper bias voltage is applied to the control gate, the source/drain and the substrate, the floating gate is charged or discharged to program or erase to have two different threshold voltages, corresponding to two logic levels.

Also, the semiconductor device should have been highly integrated so as to maintain high performance, high speed, low power dissipation and low production cost. Programming or erasing operation of the flash memory device is performed by injecting charge into the floating gate or rejecting charge therefrom through a tunneling insulating layer. The floating gate can be charged or discharged using Fouler-Nordheim tunneling (F-N tunneling) or channel-hot-carrier injection. In F-N tunneling, a large voltage is applied between the control gate and the substrate resulting in charge accumulating in the floating gate. If the tunneling insulating layer is too thin, charge tunnels the thin tunneling insulating layer at below the programming voltage or even without an external bias voltage. Accordingly, such restriction to the thickness of the tunnel oxide layer serves as an obstacle to achieve a high integration density.

Recently, there has been provided a flash memory device having a multi-gate structure where a plurality of channels are formed, for example, a double gate structure and a triple gate structure.

A flash memory device of multi-gate structure using a silicon fin and a method of forming the same are disclosed in Korea Patent No. 10-0420070. The flash memory device is schematically illustrated in FIGS. 1A and 1B. Reference number 2b in FIGS. 1A and 1B indicates a bulk silicon substrate, reference number 4 indicates a fin active region, reference number 6 indicates a first oxide layer, reference number 10 indicates a second oxide layer, reference number 12 indicates a tunneling oxide layer, reference number 16 indicates a control electrode, reference number 32 indicates a storage electrode, and reference number 34 indicates an oxide layer between electrodes.

However, according to the Korea Patent No. 10-0420070, when the control electrode 16 is defined using photolithography, the fin active region 4 and the tunneling oxide layer 12 can be attacked. If the tunneling oxide layer 12 is attacked deeply, a data retention characteristic of the flash memory device is degraded and the device reliability can not be ensured.

In addition, neighboring control electrodes can be electrically connected, since the control gate is formed crossing over a fin active region 4 having a protruding structure. Accordingly, when over-etching is performed to prevent electrical connection between neighboring control electrodes, sidewalls of silicon fins used as a channel region can be attacked by the etching.

SUMMARY OF THE INVENTION

In accordance with one aspect, the present invention is directed to a semiconductor memory device having a gate-all-around structure. The semiconductor memory device comprises: a semiconductor fin connected to a semiconductor substrate and including a hole; a charge storage layer formed on both sides and a top surface of the semiconductor fin over the hole, both sides of the semiconductor fin under the hole, and inner surfaces of the semiconductor fin that are defined by the hole, with an interposing tunneling insulating layer therebetween; and a gate electrode formed on the charge storage layer, with an interposing blocking insulating layer therebetween.

According to the semiconductor memory device, the semiconductor fin between the hole and the gate electrode (that is, a silicon fin that defines sides and a top surface of the semiconductor fin and a top surface of the hole) and a semiconductor fin that defines sides of the hole and a bottom surface may serve as a channel. Therefore, an ability of the gate electrode for controlling the channel is improved compared to a double gate structure and a triple gate structure. Therefore, the device integration density is high.

In one embodiment, the charge storage bayer is formed of nano-crystal, quantum dot, silicon, silicon-germanium, metal or mitride.

In an exemplary embodiment of the present invention, the semiconductor fin comprises: a first semiconductor pattern formed from the semiconductor substrate to define a bottom surface of the hole; a second pattern stacked on the first semiconductor pattern to define sides of the hole; and a third semiconductor pattern stacked on the second pattern to define a top surface of the hole. Therefore, all the surfaces of the third semiconductor pattern, the sides of the second pattern and the top surface of the first semiconductor pattern may serves as a channel.

In an exemplary embodiment of the present invention, the second pattern may be a second semiconductor pattern having an etch selectivity with respect to the first semiconductor pattern and the third semiconductor pattern. In this case, the second semiconductor pattern is silicon-germanium and the first semiconductor pattern and the third semiconductor pattern are silicon. In addition, the semiconductor fin may further include the second semiconductor pattern including the hole and the third semiconductor pattern that are stacked repeatedly once or more times. In this case, the semiconductor fin includes a plurality of holes that are formed in the second semiconductor pattern, aligned vertically. Therefore the device integration density is improved.

In an exemplary embodiment of the present invention, the second pattern can be a buried oxide pattern. In this case, all of the surfaces of the third semiconductor pattern and the top surface of the first semiconductor pattern may serve as a channel.

In the above semiconductor memory device, the charge storage layer may be formed of nano-crystal, quantum dot, silicon, silicon-germanium, a metal layer or a nitride layer. If the charge storage layer is a conductive layer, it may be electrically isolated from the charge storage layer formed on a neighboring semiconductor fin.

In another aspect, the present invention is directed to a semiconductor memory device comprising: a semiconductor fin that is connected to a semiconductor substrate and includes a hole; a tunneling insulating layer formed on both sides and a top surface of the semiconductor fin over the hole, sides of the semiconductor fin under the hole, and inner surfaces of the semiconductor fin that are defined by the hole; a charge storage layer formed on a tunneling insulating layer on sides of a semiconductor fin under and over the hole and on a tunneling insulating layer on inner surfaces of semiconductor fin that are defined by the hole, the tunnel insulating layer being interposed therebetween; a blocking insulting layer that is formed on the tunneling insulating layer on a top surface of the semiconductor fin of the hole and on the charge storage layer and fills the hole; and a gate electrode formed on the blocking insulating layer outside the hole.

According to the semiconductor memory device, the charge storage layer is not formed on the top surface of the semiconductor fin over the hole but formed in the hole. The tunneling insulating layer and the blocking insulting layer exist between the top surface of the semiconductor fin over the hole and the gate electrode layer. Also, the tunneling insulating layer, the charge storage layer, the block insulating layer and the gate electrode are placed on the surface of the semiconductor fin except the top surface of the semiconductor fin over the hole and this structure may serve as a nonvolatile memory device.

In accordance with another aspect, the invention is directed to a method for forming a semiconductor memory device having a gate-all-around structure comprising: forming a semiconductor fin that is connected to the semiconductor substrate and includes a hole; forming a tunneling insulating layer on both sides and a top surface of the semiconductor fin over the hole, sides of the semiconductor fin under the hole and inner surfaces of the semiconductor fin that are defined by the hole; forming a charge storage layer on the tunneling insulating layer; forming a blocking insulating layer on the charge storage layer; and forming a gate electrode layer on the blocking insulating layer.

In one exemplary embodiment, forming the semiconductor fin that is connected to the semiconductor substrate and includes the hole comprises: forming a second semiconductor layer and a third semiconductor layer that are alternately stacked on the semiconductor substrate one or more times; etching the second semiconductor layer and the third semiconductor layer that are stacked alternately and a thickness of the semiconductor substrate to form the semiconductor fin comprising a first semiconductor pattern formed from the semiconductor substrate, a second semiconductor pattern formed from the second semiconductor layer and the third semiconductor pattern formed from the third semiconductor layer; forming a device isolating layer surrounding sides of the semiconductor fin; forming a material pattern having a trench exposing the semiconductor fin and a portion of the device isolating layer, on the semiconductor fin and the device isolation layer; etching the device isolating layer exposed by the trench until at least the first semiconductor pattern is exposed; and removing the second semiconductor pattern exposed under the trench to form a hole in the second semiconductor pattern, aligned under the trench.

In the above method, the charge storage layer may be formed of nano-crystal, quantum dot, silicon, silicon-germanium, a metal layer or a nitride layer.

In the above method, the semiconductor substrate and the third semiconductor layer are the same material, and the second semiconductor layer has an etch selectivity with respect to the semiconductor substrate and the third semiconductor layer. For example, the semiconductor substrate and the third semiconductor layer may be formed of silicon and the second semiconductor layer may be formed of silicon-germanium.

In the above method, an ion implantation process for a channel is performed using the material pattern as an ion implantation mask after the hole is formed.

In the above method, the forming of the material pattern having the trench exposing the semiconductor fin and a portion of the device isolating layer on the semiconductor fin and the device isolating layer, comprises: forming a dummy gate line crossing over the semiconductor fin and the device isolating layer; forming the material pattern surrounding sides of the dummy gate line; and forming the trench corresponding to the dummy gate line by removing the dummy gate line. In this case, the ion implantation process for forming the source/drain is carried out after the forming of the dummy gate line. In this case, the second semiconductor pattern at both sides of the dummy gate line, injected with the impurity ions has relatively lower etch rate than the second semiconductor pattern under the trench.

In the above method, when the second semiconductor layer and the third semiconductor layer are stacked once, the charge storage layer on a top surface of the third semiconductor pattern may be removed by an etch back process after the charge storage layer is formed.

In the above method, a buried oxide layer may be further formed before alternately stacking the second semiconductor layer and the third semiconductor layer on the semiconductor substrate one or more times. This is a method for forming a nonvolatile memory device having a gate-all-around structure using an SOI substrate, a GOI substrate or an SGOI substrate.

In another exemplary embodiment, the forming of the semiconductor fin including a hole in the semiconductor substrate, comprises: forming a second insulating layer and a third semiconductor layer on the semiconductor substrate; etching the third semiconductor layer, the second insulating layer and a thickness of the semiconductor substrate to form a semiconductor fin comprising a first semiconductor pattern formed from the semiconductor substrate, a second insulating pattern formed from the second insulating layer and a third semiconductor pattern formed from the third semiconductor layer; forming a device isolating layer for surrounding sides of the semiconductor fin; forming a material pattern having a trench exposing the semiconductor fin and a portion of the device isolating layer, on the semiconductor fin and the device isolating layer; etching the device isolating layer exposed by the trench until at least the first semiconductor pattern is exposed; and removing the second insulating pattern exposed under the trench to form a hole placed in the second insulating pattern, aligned under the trench.

In this case, the ion implantation process for the channel is carried out after the forming of the material pattern including the trench. The impurity ions are injected in the third semiconductor pattern and the second insulating pattern through the trench. Therefore, the second insulating pattern including the injected impurity ions under the trench has relatively higher etch rate than the second insulating pattern at both sides of the trench. Thus, the second insulating pattern under the trench may be selectively etched.

Also, the ion implantation process for the source/drain is performed after forming of the gate electrode.

In accordance with another aspect, the present invention is directed to a method for forming the semiconductor memory device having a double gate structure. The method for forming the semiconductor memory device having a double gate structure comprises: etching a predetermined depth of an exposed semiconductor substrate using a capping pattern formed on the semiconductor substrate and forming a device isolating layer to construct a semiconductor fin surrounded by the device isolating layer and the capping pattern; forming a material pattern having a trench exposing the semiconductor fin and a portion of the device isolating layer, on the semiconductor fin and the device isolating layer; etching the device isolating layer exposed by the trench to expose sides of the semiconductor fin; sequentially forming a conformal tunneling insulating layer, a charge storage layer and a blocking insulating layer on the exposed sides of the semiconductor fin and the capping pattern; and forming a gate electrode layer on the blocking insulating layer to fill the trench.

According to the above method, a photolithographic process need not be applied to the gate electrode layer, and additional etch damage of the semiconductor fin and the tunneling oxide layer can be prevented.

In the above method, an etch back process may be further performed to leave the charge storage layer only on sides of the semiconductor fin after the forming of the charge storage layer before the forming of the blocking insulating layer. If the charge storage layer is a conductive material layer, the etch back process may be carried out.

In the method, the capping pattern exposed by the trench may be removed to expose the top surface of the semiconductor fin after the forming of the material pattern including the trench. In this case, the semiconductor memory device having a triple gate structure may be formed.

In the above method, a thermal oxidation process or a thermal treatment process in a hydrogen ambient may be further carried out to round a sharp edge of the semiconductor fin after the exposing of sides of the semiconductor fin or the top surface and sides of the semiconductor fin and before the forming of the tunneling insulating layer.

In the above method, an ion implantation process for forming a channel may be further performed after the exposing of the sides of the semiconductor fin or the top surface and the sides of the semiconductor fin.

In the method, the forming of the material pattern having a trench exposing the semiconductor fin and a portion of the device isolating layer, on the semiconductor fin and the device isolating layer comprises: forming a buffer layer and a material layer on the semiconductor fin and the device isolating layer; and patterning the material layer and the buffer oxide layer successively.

In the above method, the gate electrode layer may be further patterned to remain only on the sides of the semiconductor fin. That is, different bias voltages may be applied to the gate electrode layers formed on sides of the semiconductor fin. Therefore, a semiconductor memory device capable of having multi level threshold voltages can be embodied.

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

FIG. 29, FIGS. 30A through 35A and FIGS. 30B through 35B are cross-sectional views of a method for forming a nonvolatile memory device having a gate-all-around structure using an SOI substrate in FIG. 29.

DETAILED DESCRIPTION OF PREFERRED EMBODIMENTS

Formation of a nonvolatile memory device having a double gate structure in accordance with the invention will now be described.

A method for forming a nonvolatile memory device having a double gate structure will be described with reference to FIG. 2, FIGS. 3A through 5A, FIGS. 3B through 5B, FIG. 6, FIGS. 7A through 8A, FIGS. 7B through 8B, FIG. 9, FIG. 10A through 12A and FIGS. 10B through 12B.

Figure 1A:
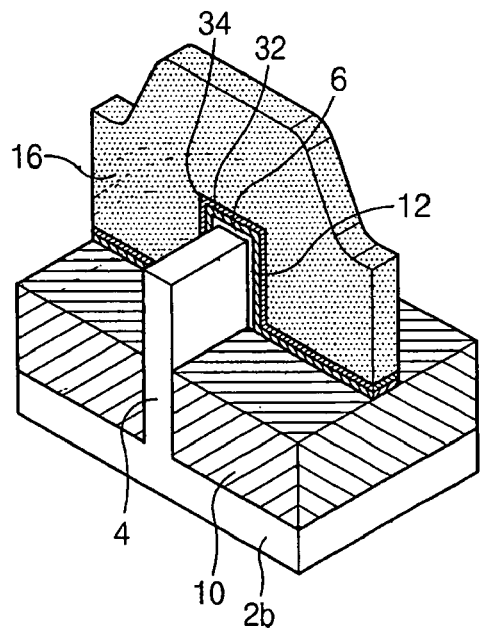
FIG. 1A and FIG. 1B are cross-sectional views of non-volatile memory device according to the prior art.
Figure 1B:
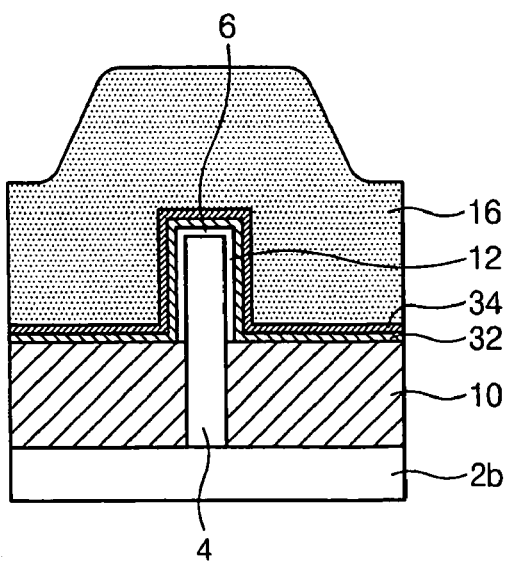
Figure 2:
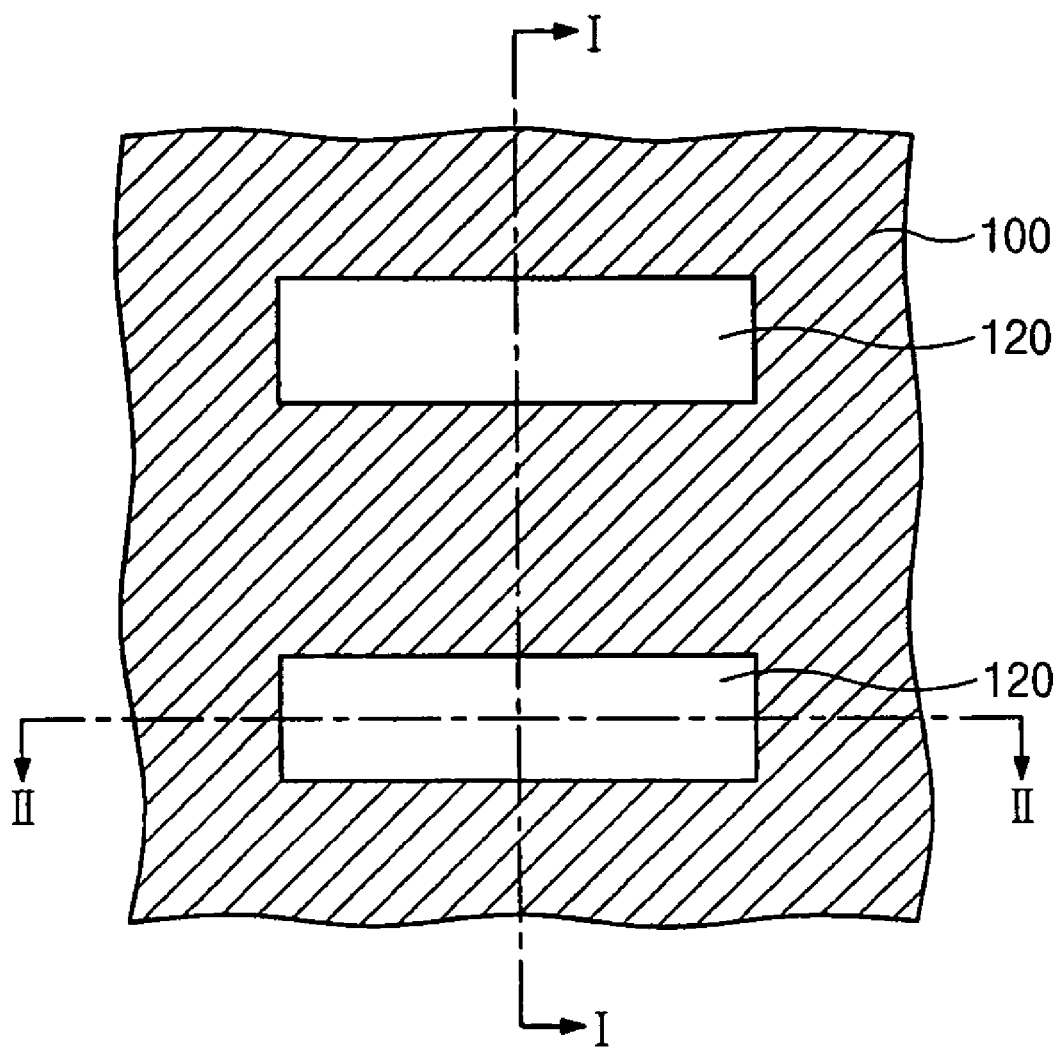
FIG. 2 is a plan view of a portion of semiconductor substrate that includes a capping layer pattern for isolating device in a method for forming a non-volatile memory device of double gate structure according to one exemplary embodiment of the present invention.
Figure 3A:
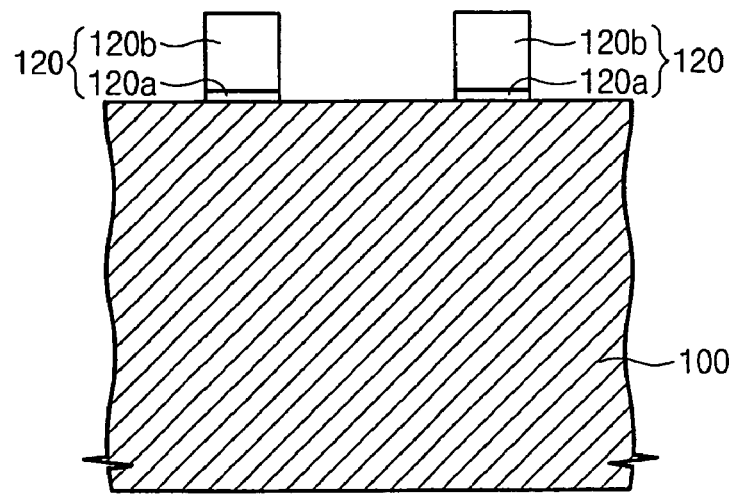
FIG. 3A, 4A and 5A are cross-sectional views taken along a line I-I of FIG. 2, and FIGS. 3B, 4B and 5B are cross-sectional views each corresponding to FIGS. 3A, 4A and 5A, respectively, taken along a line II-II of FIG. 2.
Figure 3B:
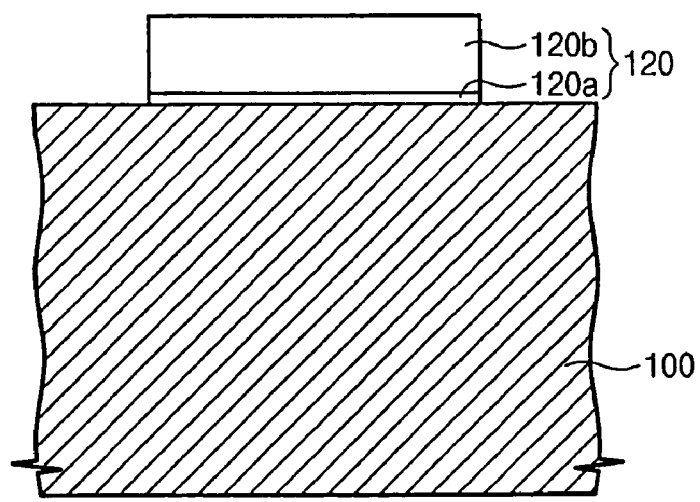
Figure 4A:
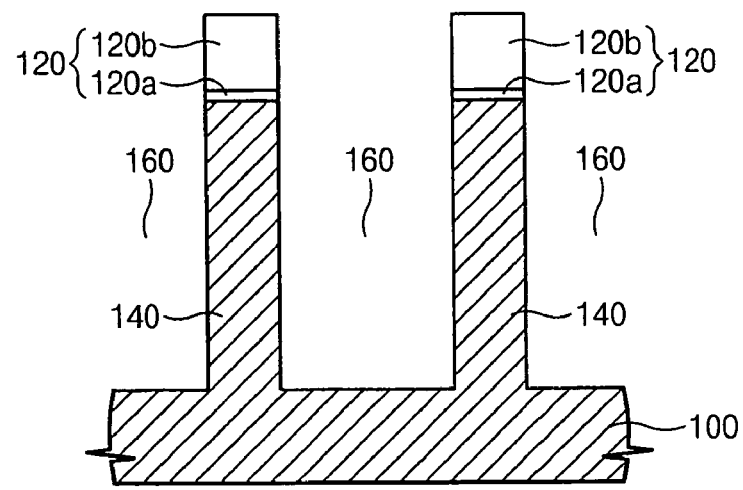
Figure 4B:
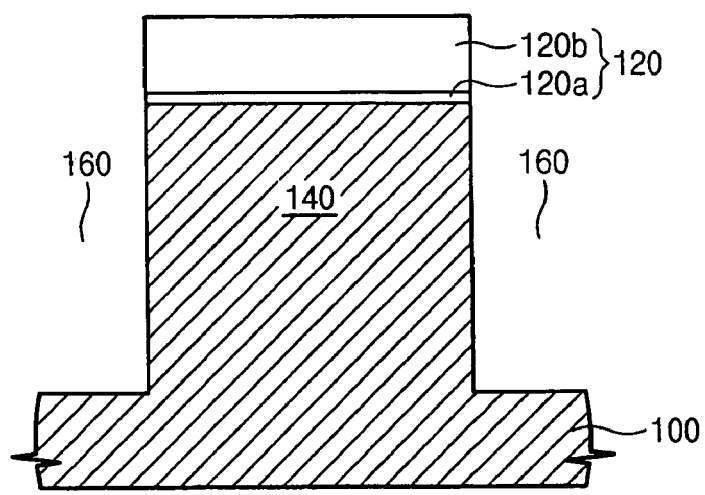
Figure 5A:
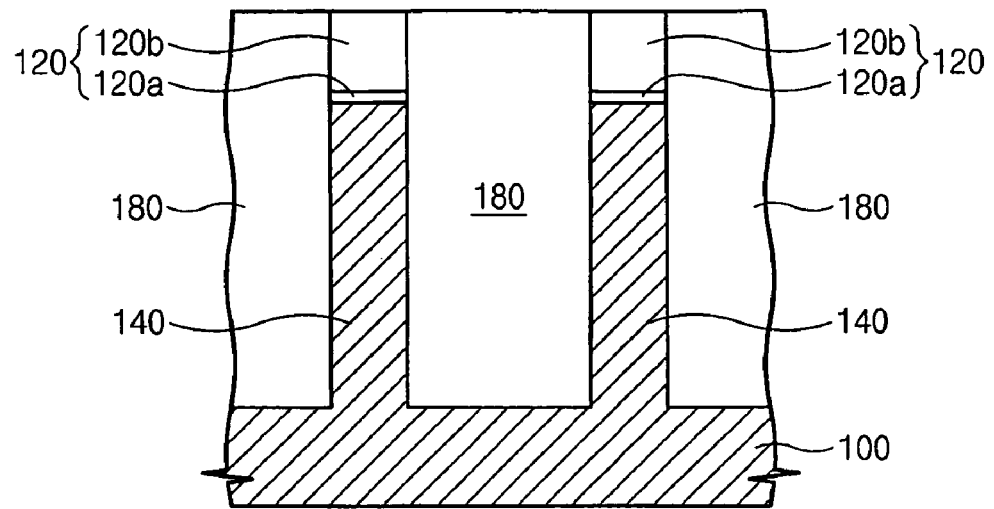
Figure 5B:
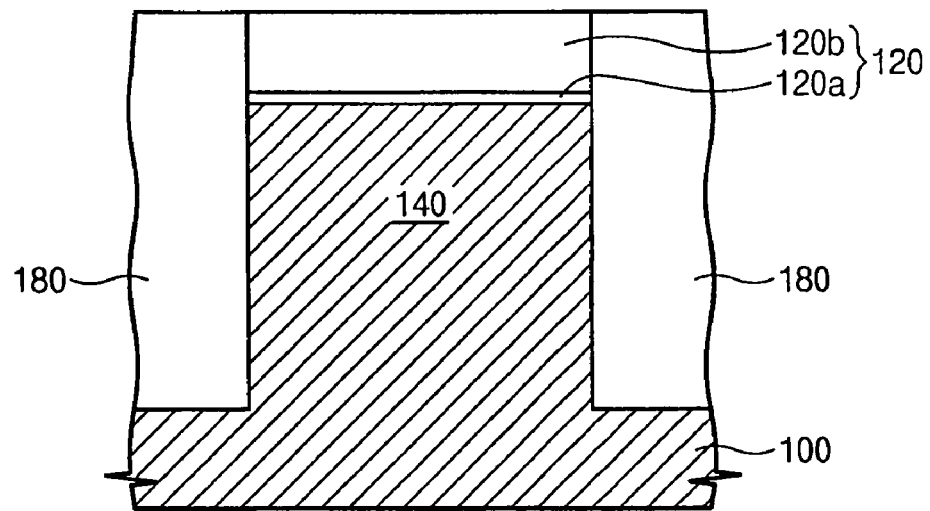

FIG. 2 is a top plan view of a semiconductor substrate, illustrating a portion of semiconductor substrate including a capping layer pattern for a device isolating layer. FIGS. 3A, 4A and 5A are cross-sectional views of a semiconductor substrate in main fabrication steps of device isolating process, taken along a line I-I of FIG. 2. FIGS. 3B, 4B and 5B are cross-sectional views corresponding to FIGS. 3A, 4A and 5A, respectively, taken along a line II-II in FIG. 2.

First, referring to FIGS. 2, 3A and 3B, a capping pattern 120 is formed on a semiconductor substrate 100. The semiconductor substrate 100 of the exemplary embodiment of the present invention is a conventional bulk silicon substrate, that is, a single crystalline silicon substrate. However, an SOI substrate where silicon is placed on an insulating layer, a GOI substrate where germanium is placed on an insulating layer, an SGOI substrate where silicon-germanium is placed on the insulating layer, a strained silicon substrate, etc. The strained silicon substrate is formed by growing silicon-germanium single crystal from a bulk silicon substrate to a predetermined thickness and growing silicon single crystal on the silicon-germanium. The strained silicon substrate has a carrier mobility that is relatively higher than that of the bulk silicon.

The capping pattern 120 is formed by sequentially stacking an oxide layer 120a and a nitride layer 120b. The oxide layer 120a is formed in a thermal oxidation process and the nitride layer 120b is formed by a thin film deposition technique such as a chemical vapor deposition CVD, for example.

Referring to FIGS. 4A and 4B, using the capping pattern 120 as an etch mask, the exposed semiconductor substrate 100 is anisotropically etched to a predetermined depth to form a semiconductor fin 140 and to define a trench 160 that becomes a device isolating region. In this case, the semiconductor fin 140 includes both sides and a top surface, and the top surface is covered with a capping layer 120.

Referring to FIGS. 5A and 5B, the trench 160 is filled with insulating material to cover sides of the semiconductor fin 140 and sides of the capping layer 120 to form a device isolating layer 180. The device isolating layer 180 is formed by a deposition and a planarization of insulating material. The deposition process of insulating material uses the well-known CVD process, plasma enhanced CVD (PE-CVD) or the like to deposit the insulating material containing an oxide layer. The planarization process applied to the insulating material may use a chemical mechanical polishing process or an etch back process. A thermal oxidation process for healing the etch damage and a process for forming oxidation barrier layer may be performed before forming the device isolating layer 180. A thermal oxide layer may be formed on sides of the semiconductor fin by the thermal oxidation process.

Figure 6:
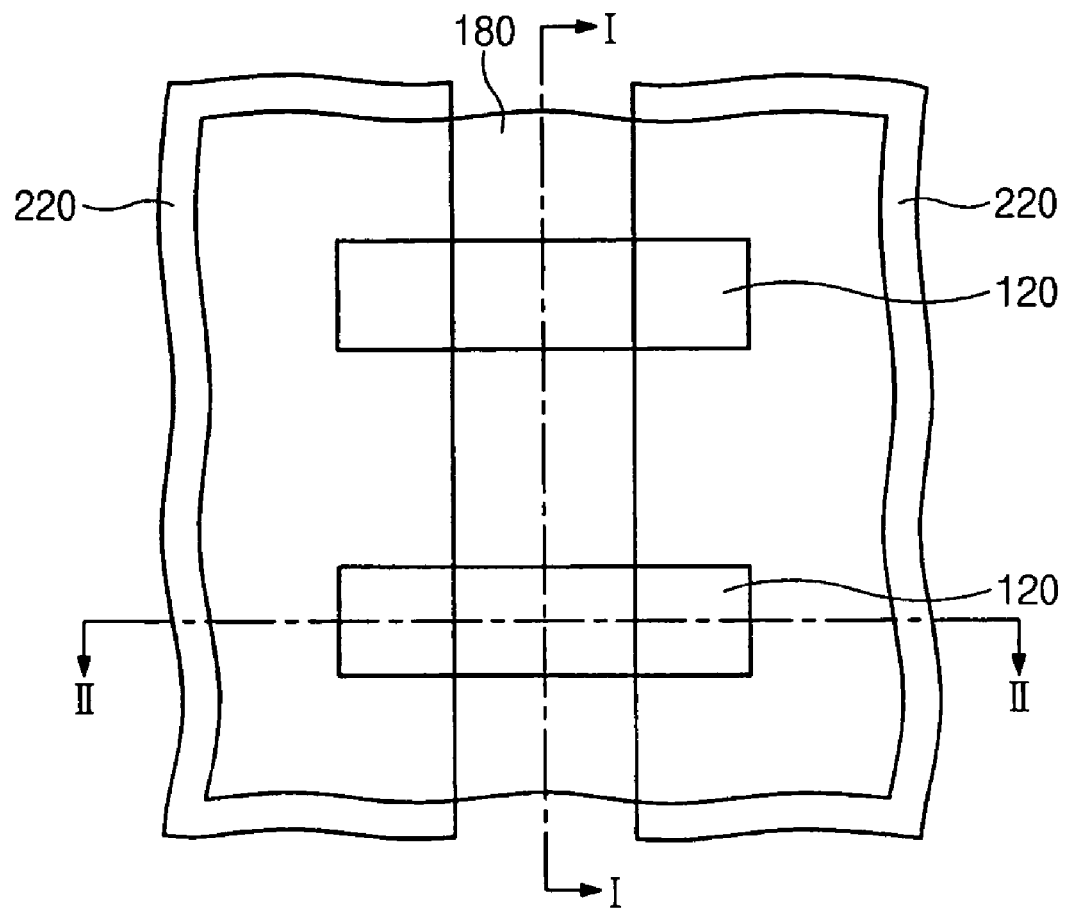
FIG. 6 is a plan view of semiconductor substrate in the fabrication steps following the steps in FIGS. 5A and 5B, where the semiconductor substrate includes a device isolating layer and a gate electrode that is formed after the device isolating layer for defining a gate electrode.
Figure 7A:
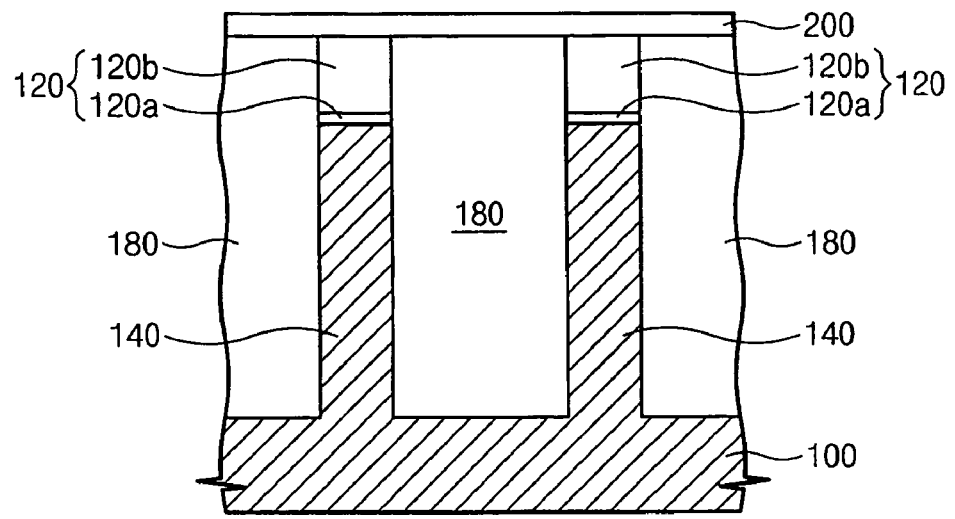
FIGS. 7A and 8A are cross-sectional views, taken along line I-I of FIG. 6.

FIG. 6 is a top plan view of a portion of semiconductor substrate including a material pattern 220 for defining a control electrode, that is, a gate electrode, after forming the device isolating layer 180. FIGS. 7A and 8A are cross-sectional views taken along line I-I of FIG. 6, and FIGS. 7B and 8B are cross-sectional views taken along line II-II of FIG. 6.

Figure 7B:
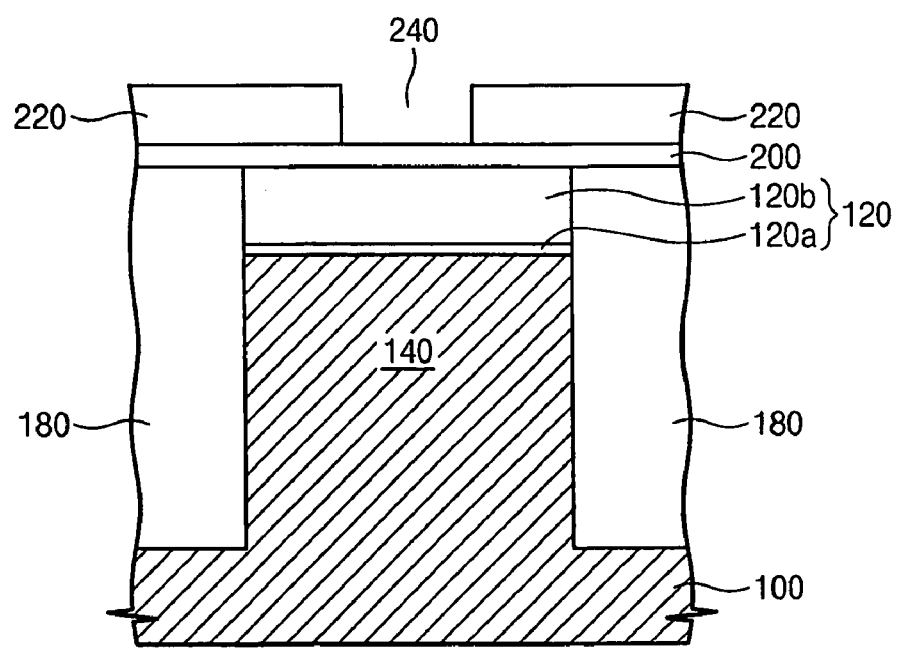
FIGS. 7B and 8B are cross-sectional views, taken along line II-II of FIG. 6.
Figure 8A:
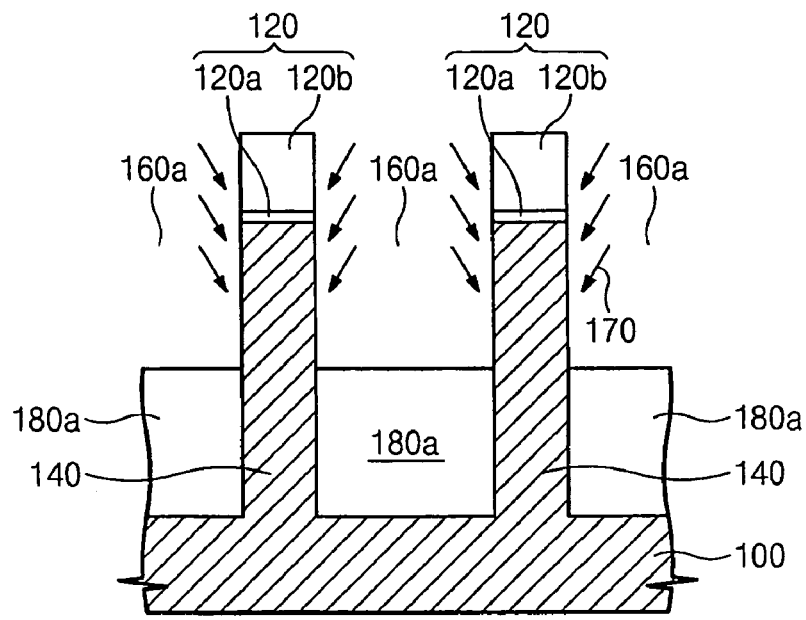

Referring to FIGS. 6, 7A and 7B, after forming the device isolating layer 180, an optional buffer oxide layer 200 is formed on the device isolating layer 180 and capping pattern 120. A material layer 220 having a trench for defining a gate is formed on the optional buffer oxide layer 200. That is, a material layer 220 is formed on the optional buffer oxide layer 200 and then a damascene process is performed to form a trench 240 in the material layer where the gate electrode layer is to be formed. In this case, the trench 240 for defining the gate electrode crosses over neighboring semiconductor fins. The material layer 220 is formed of material having an etch selectivity with respect to the buffer oxide layer 200, for example, a nitride layer.

Figure 8B:
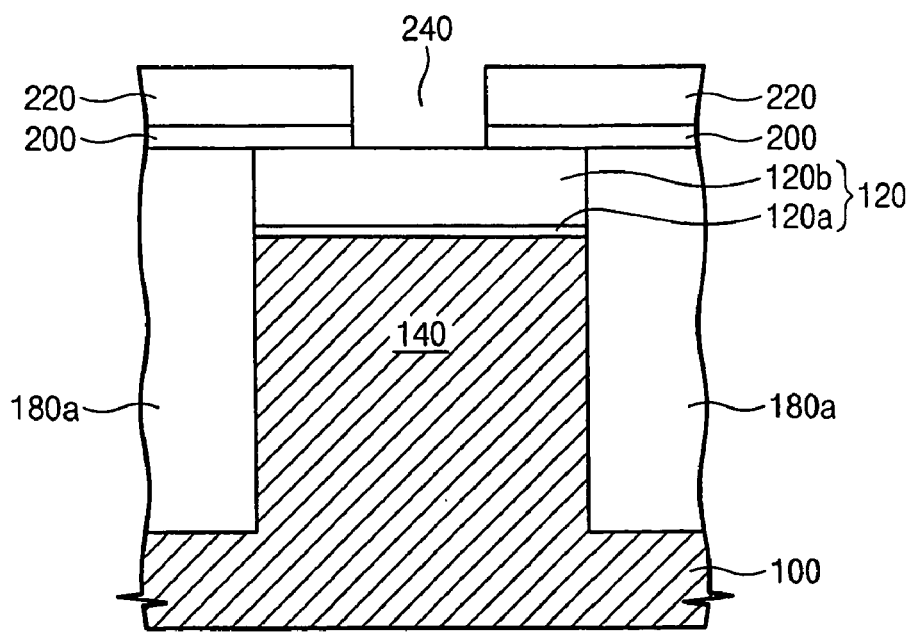

Next, referring to FIGS. 8A and 8B, the exposed optional buffer oxide layer 200 is etched and the exposed device isolating layer 180 is etched to a predetermined depth to expose sides of semiconductor fin 140. That is, a height of device isolating layer is lowered. In this case, etching of the optional buffer oxide layer 200 and device isolating layer 180 uses an etch gas or an etch solution having high etch rate with respect to the oxide layer while not etching the nitride layer. When the optional buffer oxide layer 200 and the device isolating layer 180 that is one of material layers containing oxygen, a portion of oxide layer 120a of the capping pattern 120 is etched to expose a sharp top edge of the semiconductor fin 140.

The region 160a that is defined by removing a portion of device isolating layer 180 is referred to herein as 'a residual trench'.

A channel ion implantation process 170 is performed. In the channel ion implantation process 170, impurity ions are implanted in sides of the semiconductor fin 140 using a halo ion implantation.

To round the sharp top edge of the semiconductor fin 140, an optional cleaning process may be carried out after performing a thermal oxidation or hydrogen annealing process. In this case, if the top edge of the semiconductor fin 140 is exposed in the process for removing a buffer oxide layer 200 and the device isolating layer 180, the optional process is more effective. By rounding the top edge of the semiconductor fin 140, an occurrence of a parasitic transistor may be prevented.

Figure 9:
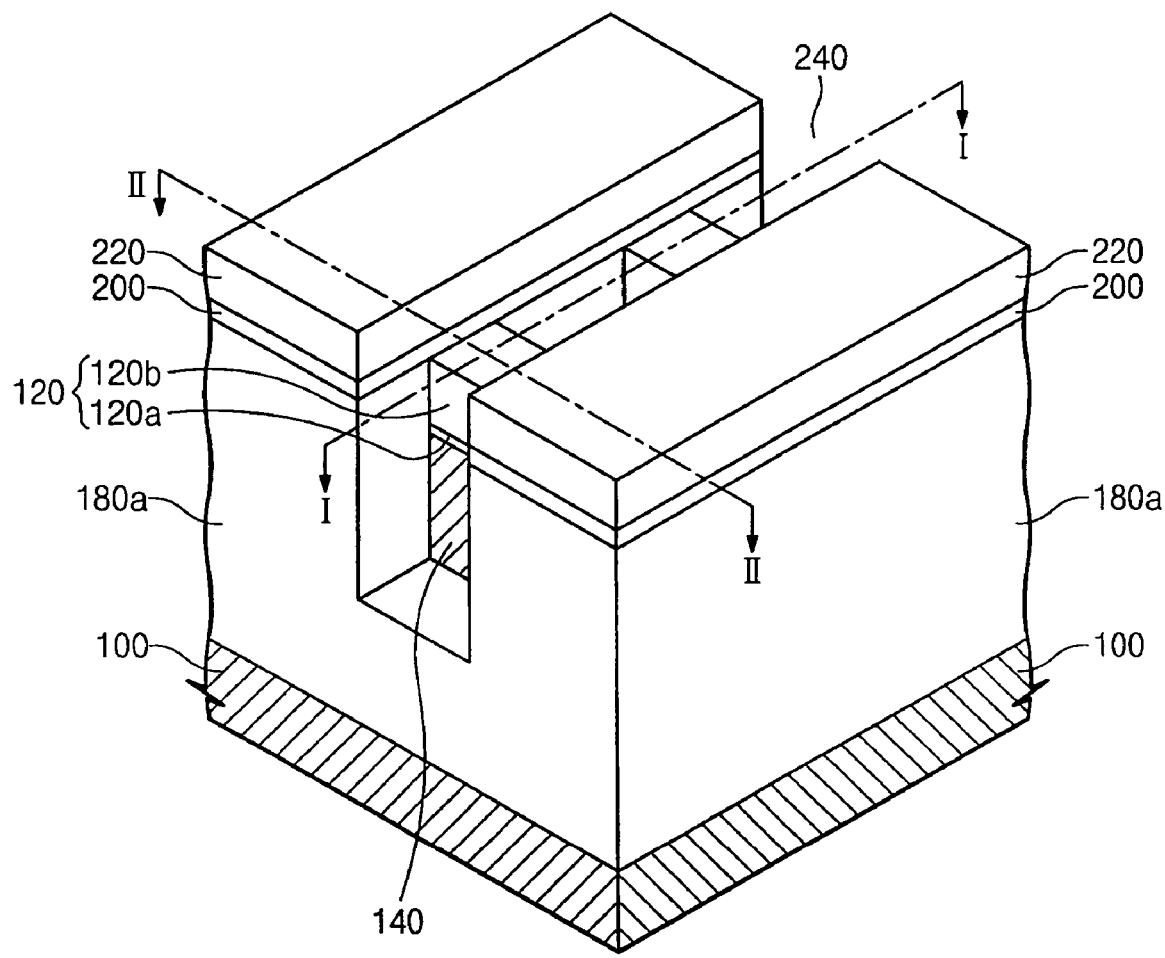
FIG. 9 is a schematic cross-sectional view of a semiconductor substrate in the steps following the steps in FIGS. 8A and 8B, and illustrates a semiconductor substrate when sides of the semiconductor fins are exposed.

FIG. 9 is a schematic perspective cross-sectional view of the device when the sides of semiconductor fin 140 are exposed.

Figure 10A:
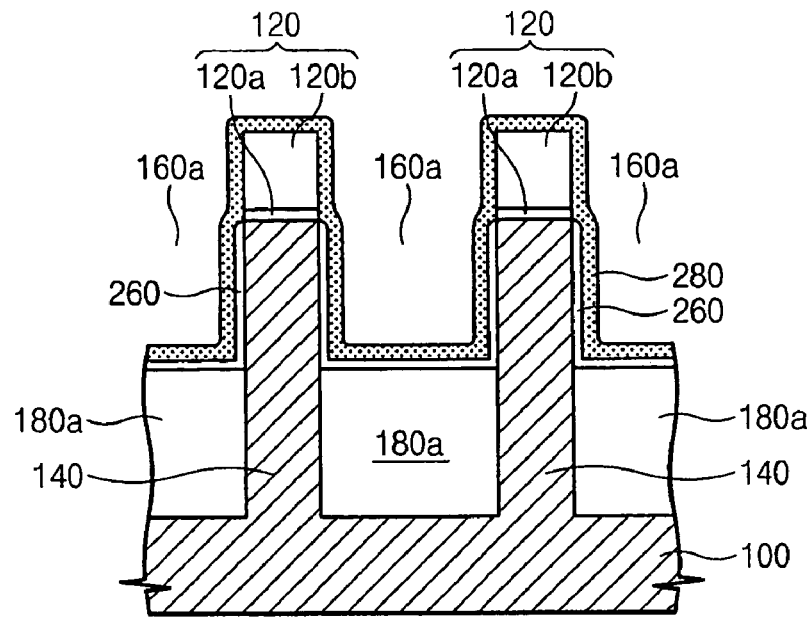
FIGS. 10A, 11A and 12A are cross-sectional views taken along line I-I of FIG. 9.
Figure 10B:
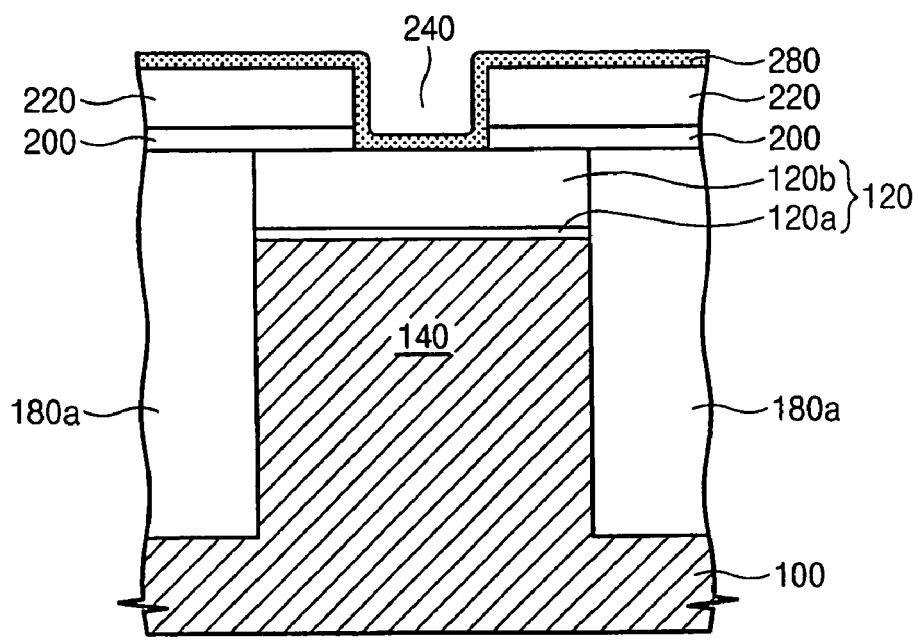
FIGS. 10B, 11B and 12B are cross-sectional views taken along a line II-II of FIG. 9.
Figure 11A:
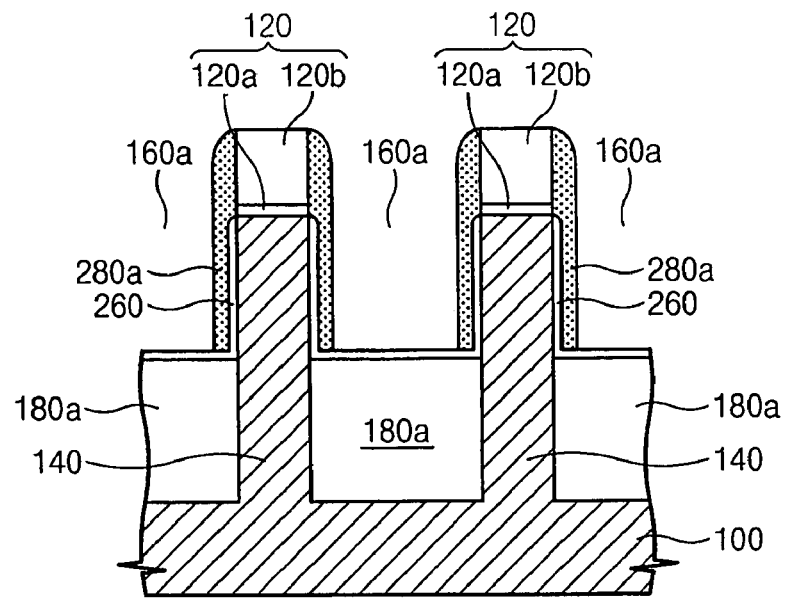
Figure 11B:
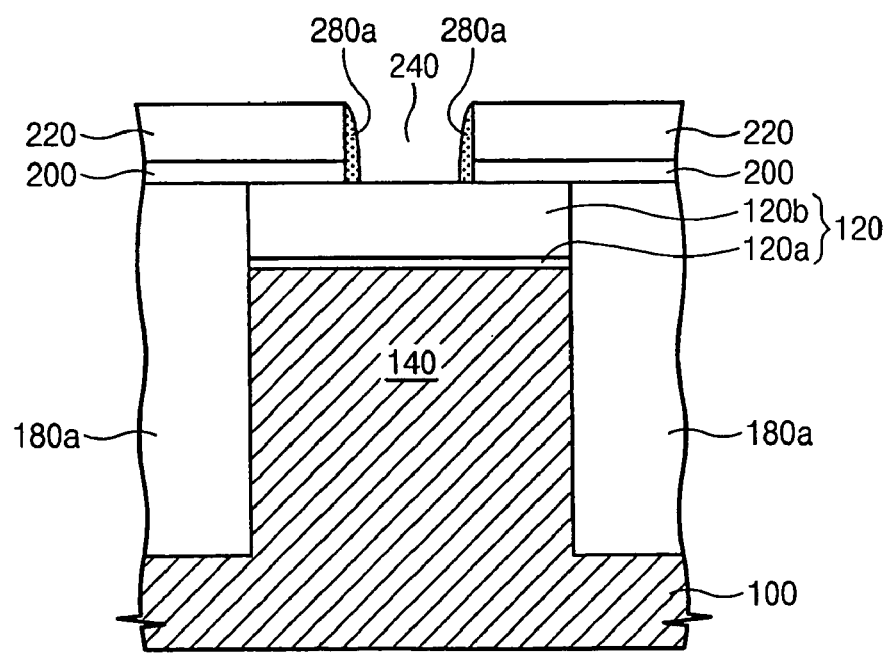
Figure 12A:
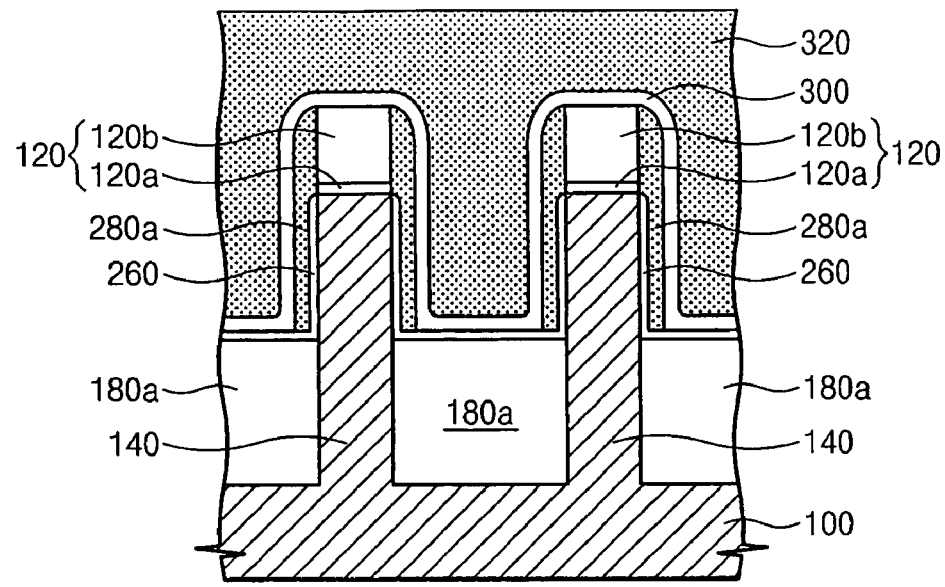

FIGS. 10A, 11A and 12A are cross-sectional views taken along line I-I of FIG. 9, and FIGS. 10B, 11B and 12B are cross-section views taken along line II-II of FIG. 9.

Referring to FIGS. 10A and 10B, a tunneling insulating layer 260 is formed on the sides of exposed semiconductor fin 140 and then a conformal charge storage layer 280 is formed on an entire surface of the structure. The charges are accumulated in the charge storage layer 280 from the semiconductor fin 140 through the tunneling insulating layer 260 or charges accumulated in the charge storage layer 280 are removed therefrom to the semiconductor fin 140 through the tunneling insulating layer 260.

The tunneling insulating layer 260 may be formed of, for example, an oxide layer, and to a proper thickness that is required in accordance with required device characteristics. The charge storage layer 280 is a conductive layer or an insulating layer capable of trapping charge. For example, a charge storage layer 280 is formed of nano-crystal, quantum dot, silicon, silicon-germanium, metal, nitride, etc.

Referring to FIGS. 11A and 11B, an optional etch back process is applied to the charge storage layer 280, thereby leaving the charge storage layer on the sides of semiconductor fin 140 and the capping pattern 120 to form a spacer-shaped charge storage layer 280a. That is, the charge storage layers formed on the semiconductor fins 140 are electrically isolated from each other. When the charge storage layer 280 is formed of conductive material, the optional etch back process may be preferably carried out to the charge storage layer 280.

Figure 12B:
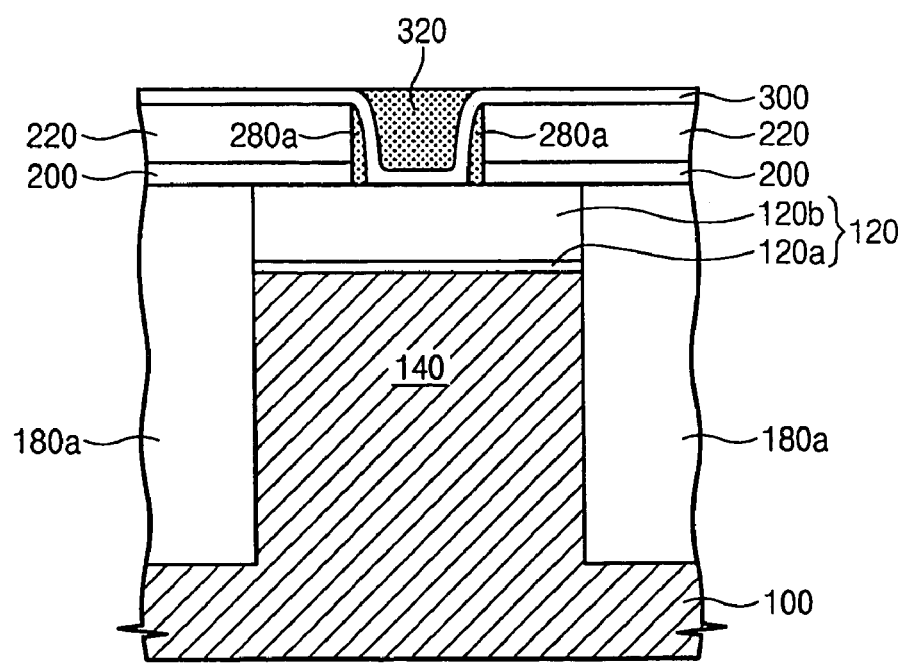

Next, referring to FIGS. 12A and 12B, a conformal block insulating layer 300 is formed, and then a gate electrode layer is formed to fill entire trench 240 and residual trench 160a. A planarization process is performed to form a gate electrode 320 that is electrically isolated. In this case, the planarization process can be performed by the CMP process or etch back process, until a blocking insulating layer 300 is exposed. Alternatively, the planarization process may be performed until the capping pattern 120 is exposed. After the planarization process is carried out, an optional etch back process is applied to the gate electrode to lower a height of the gate electrode to lower than that of the material pattern. Then, an insulating layer may be formed on a top surface of the gate electrode. In this case, the insulating layer may have an etch selectivity with respect to the material pattern.

Alternatively, after performing the planarization process for forming the gate electrode, a silicidation process is carried out to from a silicide layer on a top surface of the gate electrode 320.

As a subsequent process, the capping pattern 120 at both sides of the gate electrode 320 is removed and then an ion implantation process for forming source/drain is carried out. In this case, when the capping pattern 120 is formed by stacking the oxide layer 120a and the nitride layer 120b, an ion implantation process for source/drain may be carried out.

According to the method for forming a nonvolatile memory device having a double gate structure, a CMP process or an etch back process is carried out instead of a conventional photolithographic process applied to the gate electrode. Therefore, a semiconductor fin or a tunneling insulating layer may be protected from etch damage.

In a method for forming the above nonvolatile memory device having a double gate structure, when the charge storage layer 280 is formed of conductive material, a floating type flash memory device may be formed finally, and when the charge storage layer 280 is formed of insulating material, a SONOS device or a MONOS device will be formed.

Formation of a memory device having a multi level double gate structure in accordance with the invention is now described.

Figure 13A:
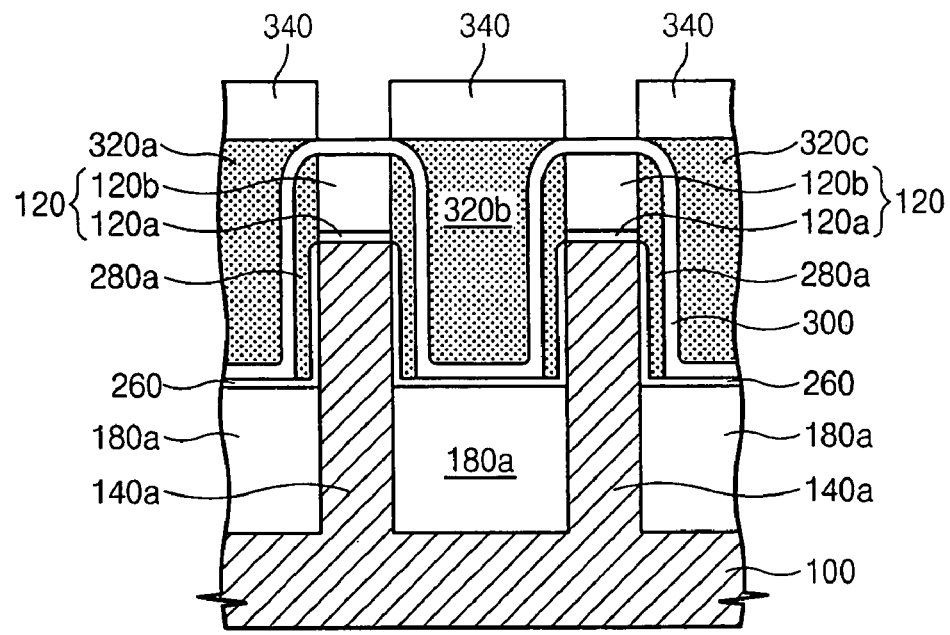
FIGS. 13A and 13B are cross-sectional views of a semiconductor substrate in the steps following the steps in FIGS. 12A and 12B.
Figure 13B:
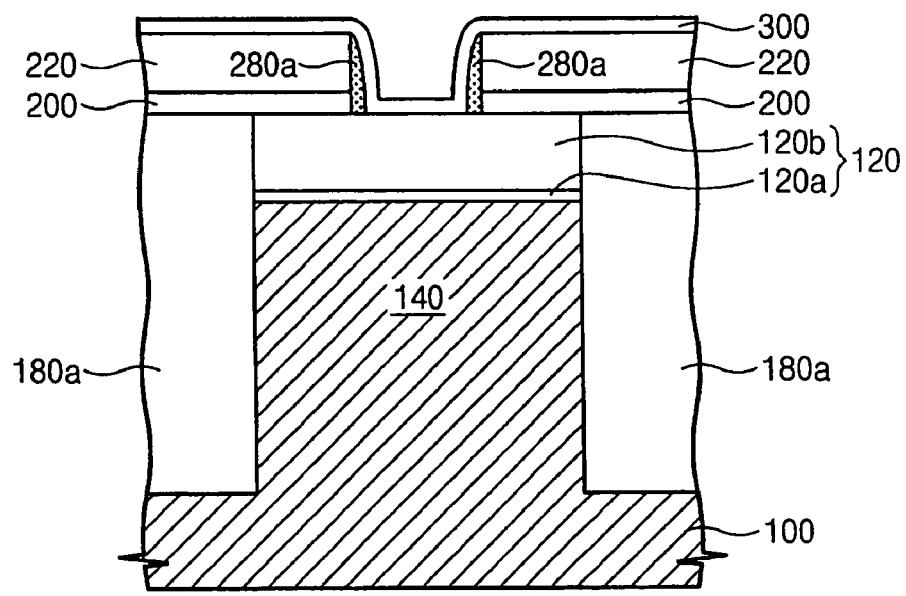

In the above method for forming a nonvolatile memory device of double gate structure, the gate electrode 320 is formed, and then a photolithographic process is carried out to remove a gate electrode on a top surface of the semiconductor fin 140 as illustrated in FIGS. 13A and 13B. Therefore, each of the gate electrodes 320a, 320b, and 320c remains on sides of the semiconductor fins, thereby forming two gate electrodes that are electrically isolated. For example, referring to FIG. 13A, the semiconductor fin 140a is controlled by two gates 320a and 320b that are electrically isolated and the semiconductor fin 140b is controlled by two gates 320b and 320c that are electrically isolated. Thus, different bias voltages may be applied to the two gate electrodes to embody a memory device having multi level threshold voltage.

Figure 14A:
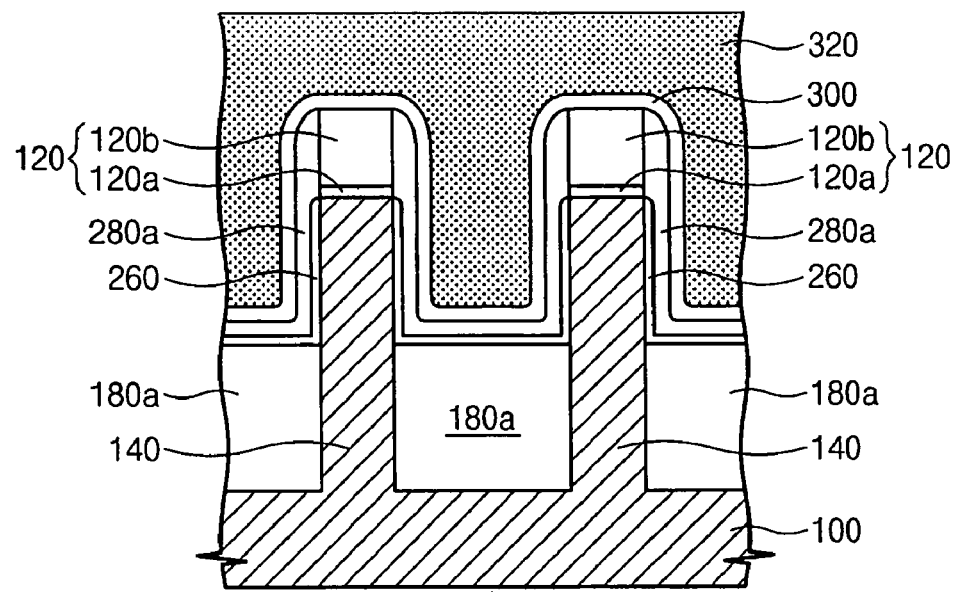
FIGS. 14A and 14B are cross-sectional views of a nonvolatile memory device according to exemplary embodiments of the present invention.
Figure 14B:
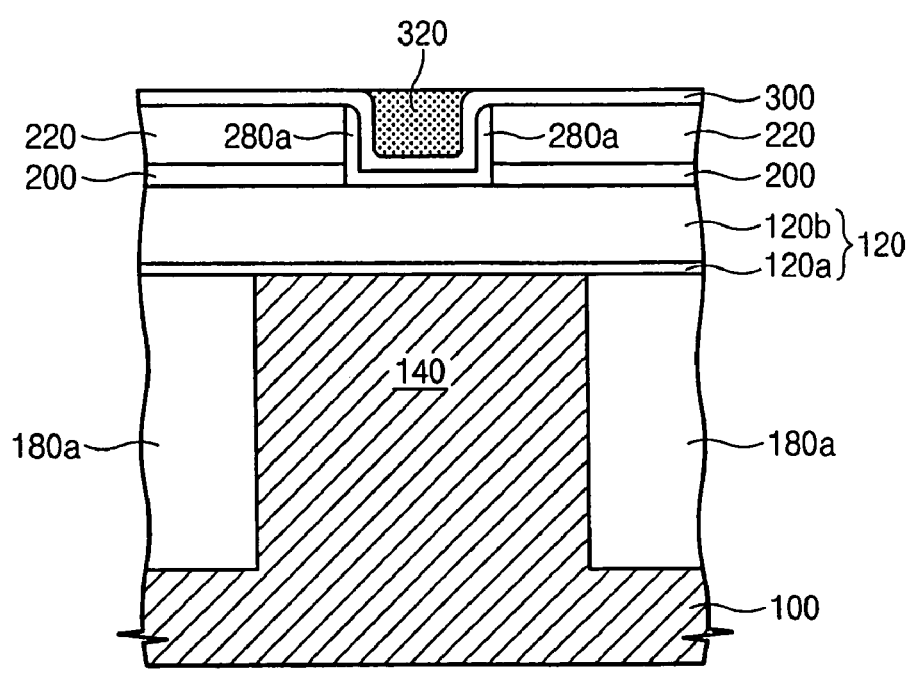

FIGS. 14A and 14B illustrate a semiconductor device that is formed when an etch back process is not applied to the charge storage layer 280 in the above method.

A method for forming a nonvolatile memory device having a triple gate structure will now be described.

Referring to FIGS. 15A, 16A and 17A and FIGS. 15B, 16B and 17B, a method for forming a nonvolatile memory device having a triple gate structure is described. First, the fabrication steps described with reference to FIG. 2, FIGS. 3A through 5A, FIGS. 3B through 5B, FIG. 6, and FIGS. 7A and 7B are carried out. That is, the device isolating process is carried out to form a semiconductor fin 140 and a device isolating layer 180, and then a material layer 220 including a trench for defining a gate electrode is formed on the device isolating layer 180 and a capping pattern 120.

Figure 15A:
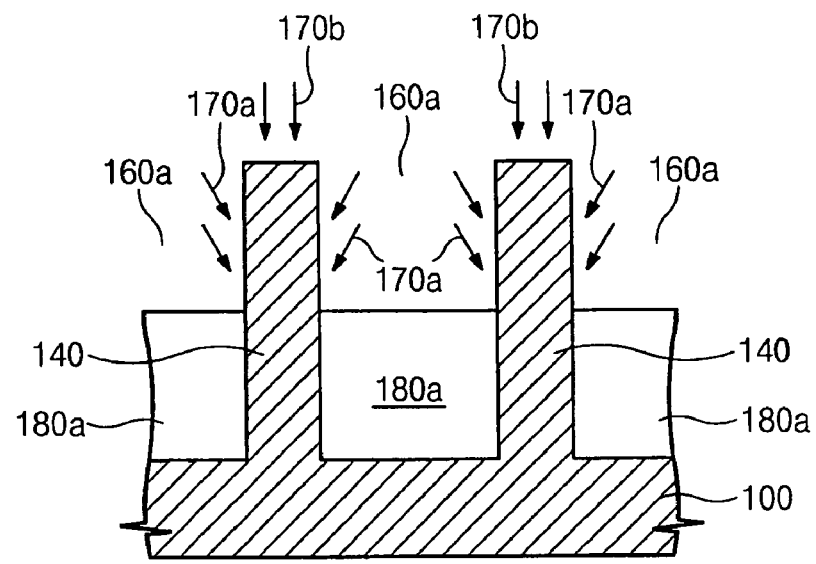
FIGS. 15A, 16A and 17A and FIGS. 15B, 16B and 17B are cross-sectional views of a method for forming a nonvolatile memory device having a triple gate structure according to one exemplary embodiment of the present invention.
Figure 15B:
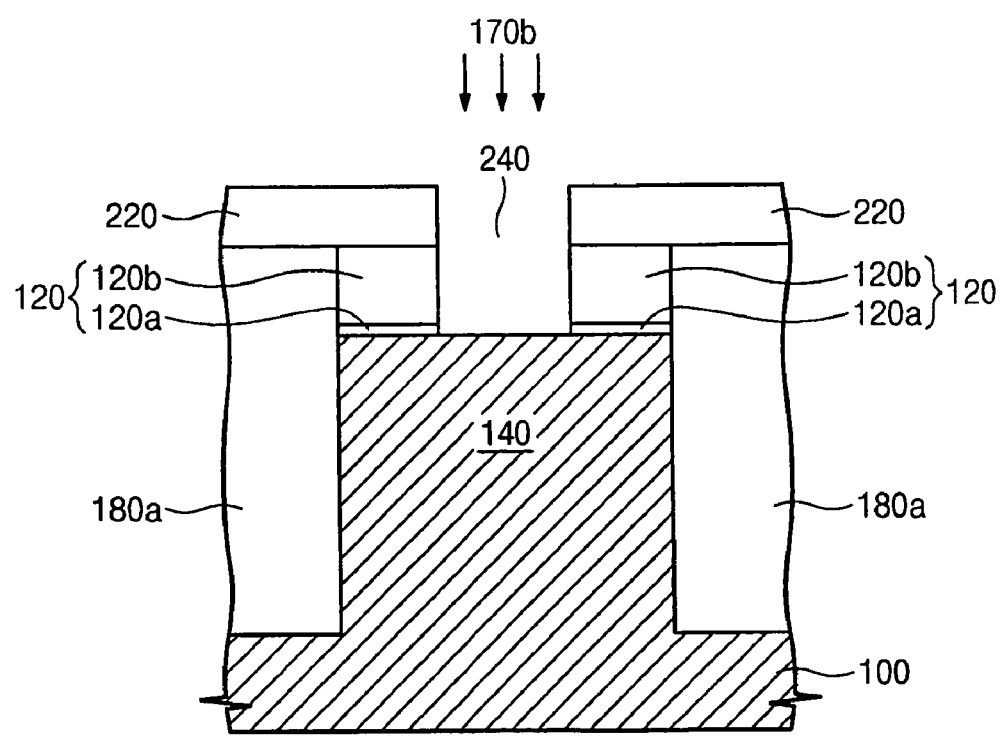

Referring to FIGS. 15A and 15B, a portion of device isolating layer 180 exposed by a trench 240 is removed to expose sides and a top surface of the semiconductor fin 140. In this case, a residual trench 160a is defined at the region where a portion of the device isolating layer is removed. Specifically, the material layer 220 may be formed by sequentially stacking an oxide layer and a nitride layer or sequentially stacking the nitride layer and the oxide layer.

When the material layer 220 is formed of the sequentially stacked oxide layer and nitride layer, a portion of device isolating layer that is exposed first is etched, and the a capping pattern is removed. In this case, when a portion of device isolating layer is etched, a top portion of the material layer 220 is not etched because it is formed of nitride. Also, when the capping pattern is removed after the removal of a portion of the device isolating layer, a nitride layer constituting a top portion of the material layer 220 may be etched at the same time. As a result, some thickness of the residual material layer 220 may be reduced.

To the contrary, when the material layer 220 is formed of sequentially stacked nitride layer and oxide layers, the capping pattern is removed at first and a portion of the device isolating layer is removed. In this case, when a portion of the device isolating layer is removed, the oxide layer constituting a top portion of the material layer 220 may be removed at the same time.

In addition, the material layer 220 may be formed of material having an etch selectivity with respect to the oxide layer and the nitride layer. In this case, a thickness of the material layer 220 may not be varied.

A channel ion implantation process is performed through the trench 240 and the residual trench 160a. The channel ion implantation process uses a tilt ion implantation technique 170a for injecting impurity ions in sides of the semiconductor fin 140. In addition, the ion implantation process may further include an ion implantation technique 170b that injects impurity ions on a top surface of the semiconductor fins 140.

To round a sharp top edge of the semiconductor fin 140, an optional cleaning process may be carried out after performing a thermal oxidation or a hydrogen annealing process. In this case, the optional process may be more effective when the top edge of semiconductor fin 140 is exposed in the process for removing the buffer oxide layer 200 and the device isolating layer 180. An occurrence of an intrinsic or parasitic transistor may be prevented by rounding the top edge of the semiconductor fin 140.

Figure 16A:
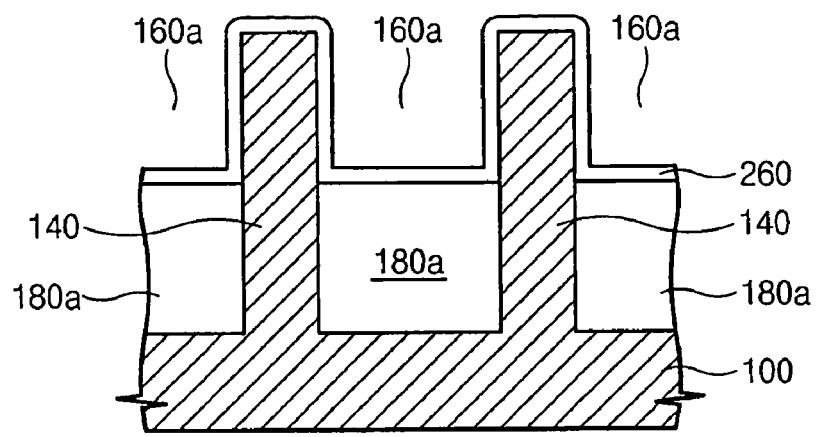
Figure 16B:
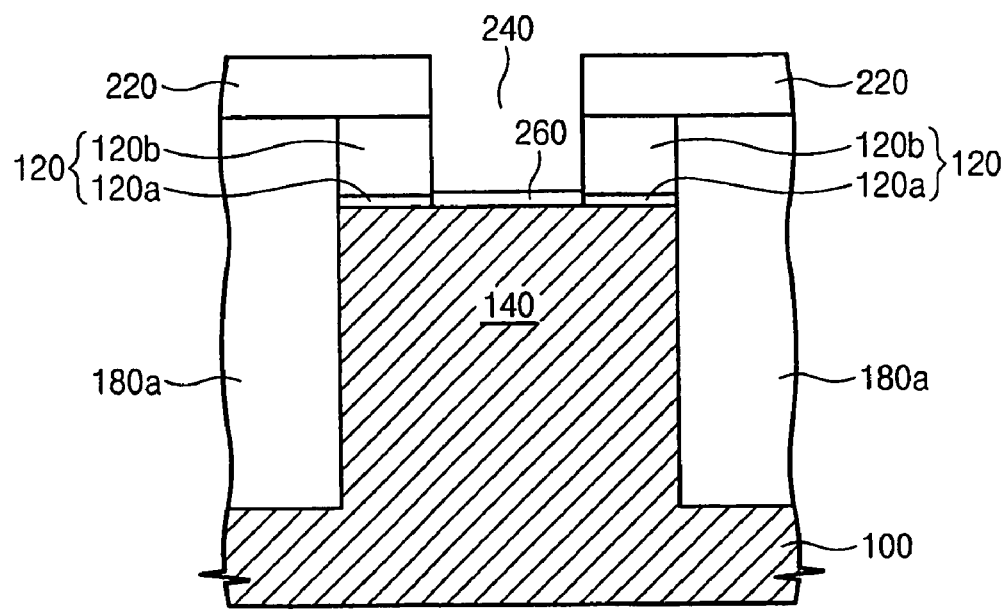
Figure 17A:
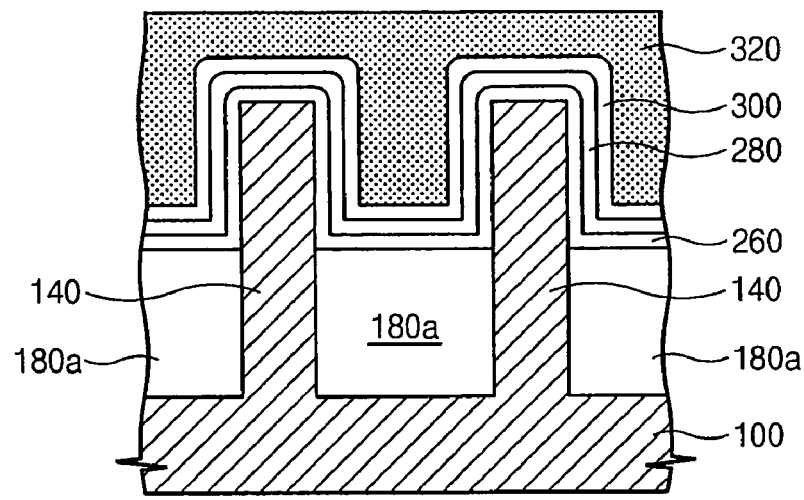
Figure 17B:
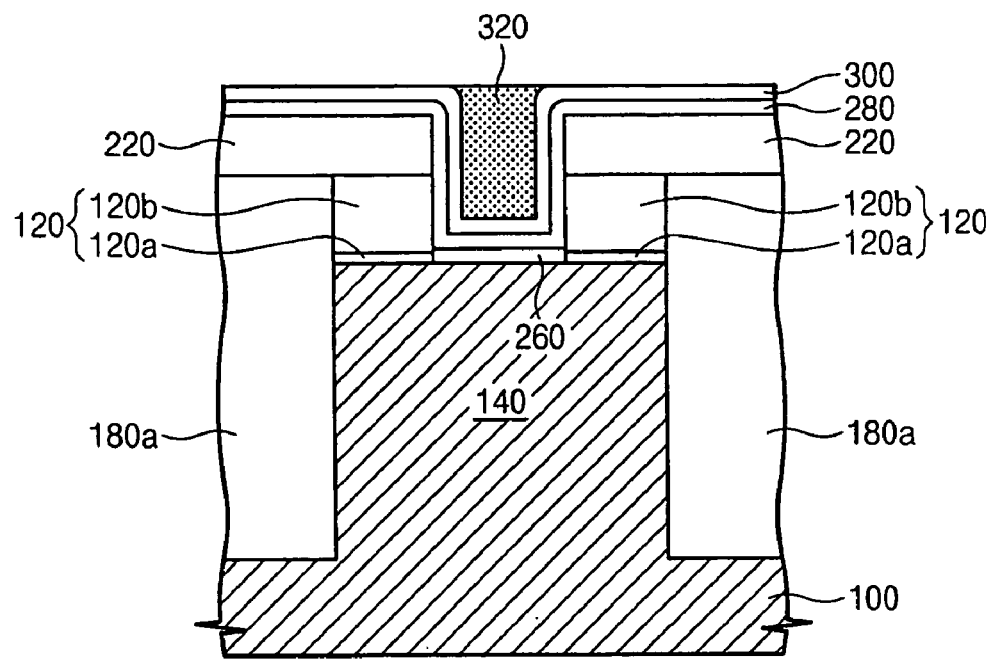

Referring to FIGS. 16A and 16B, a conformal tunneling insulating layer 260 is formed on sides of the exposed sides of semiconductor fin 140 and a top surface thereof. The tunneling insulating layer 260 may be formed of oxide. Referring to FIGS. 17A and 17B, a charge storage layer 280 and a blocking insulating layer 300 are formed on the tunneling insulating layer 260. Then, a gate electrode layer 320 is formed on a block insulating layer 300 to fill a trench 240 and a residual trench 160a. A planarization process is performed to form a gate electrode 320. The planarization process may use a CMP process or an etch back process. The planarization process may be carried out until the block insulating layer 300 or the charge storage layer 280 is exposed. Alternatively, if the charge storage layer 280 is formed of conductive material, the planarization process will be carried out until the capping pattern 120 is exposed.

In a subsequent process, the capping pattern 120 at both sides of the gate electrode 320 is removed and then an ion implantation process for source/drain is carried out.

According to the method for forming the nonvolatile memory device having a triple gate structure, the CMP process or an etch back process is performed instead of the conventional photolithographic process applied to the gate electrode layer. Therefore, the semiconductor fin or the tunneling insulating layer may be protected from etching damage.

In the method for forming the nonvolatile memory device having a triple gate structure, when the charge storage layer 280 is formed of conductive material, a floating gate type flash memory may be formed finally. When the charge storage layer 280 is formed of insulating material, the SONOS device or the MONOS device may be formed.

Methods for forming the nonvolatile memory devices having the double gate structure or the triple gate structure have been described. However, the nonvolatile memory device may be formed using various kinds of substrate such as an SOI substrate, a GOI substrate, an SGOI substrate, a strained silicon substrate, etc. without departing from the scope and the spirit of the invention.

For example, a channel can be formed on a silicon layer, a germanium layer or a silicon-germanium layer on the insulating layer in case of using the SOI substrate, the GOI substrate, the SGOI substrate. Also, the etching process for isolating device is performed until the insulating layer is exposed or a portion of the semiconductor substrate under the insulating layer is etched. The remaining processes are the same as described above. Therefore, description of these processes will not be repeated.

A method for forming a nonvolatile memory device having a gate-all-around structure using a bulk substrate in accordance with the invention will be described herein. A nonvolatile memory device using a bulk silicon substrate will be described as one exemplary embodiment. However, the substrate is only one exemplary embodiment and the present invention will not be limited to the case that uses the bulk silicon substrate. The nonvolatile memory device may be formed using the SOI substrate, the GOI substrate, the SGOI substrate, the strained silicon substrate without departing from the sprit of the present invention.

Figure 18:
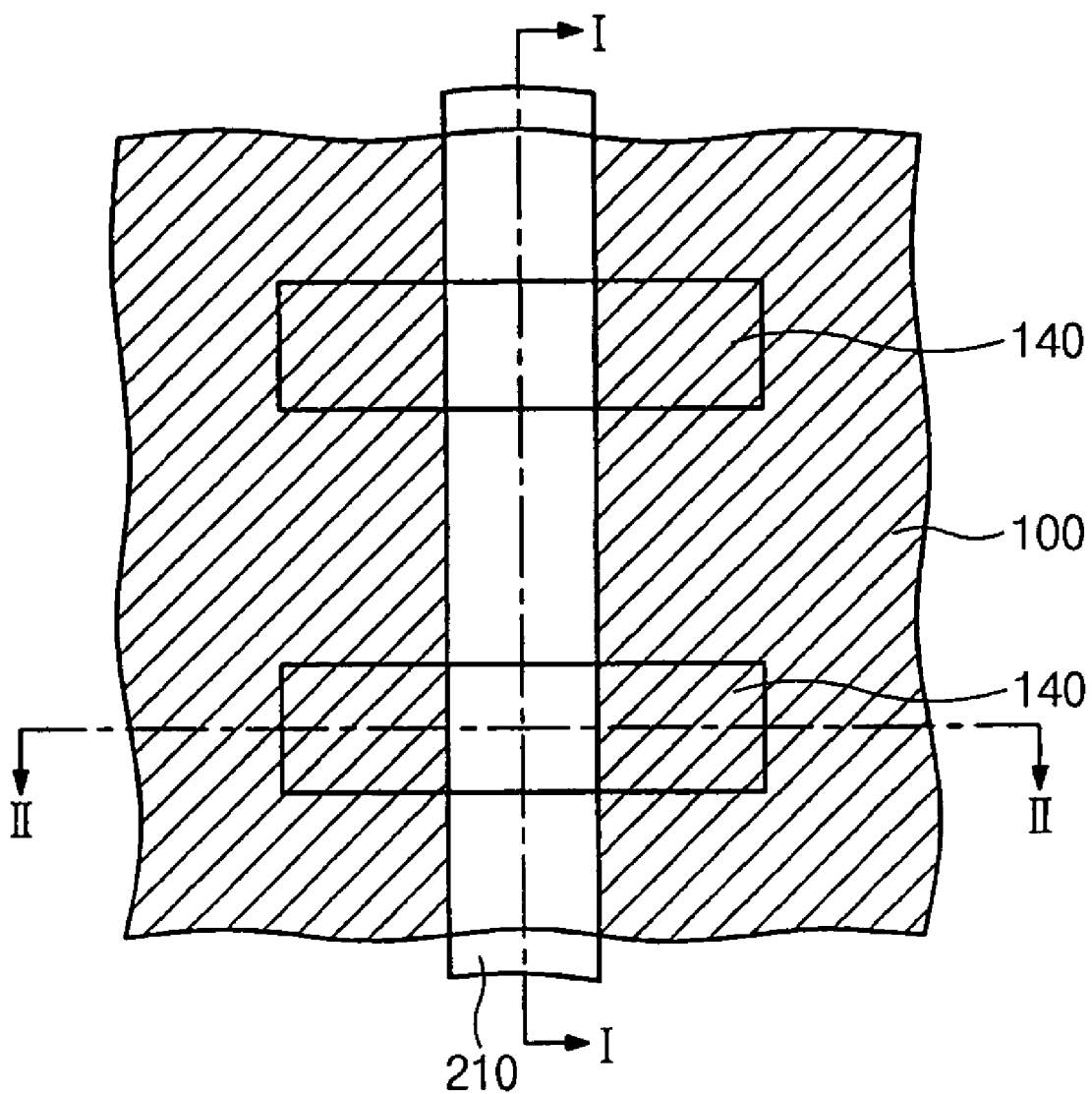
FIG. 18 is a top plan view illustrating a semiconductor substrate including a dummy gate pattern after forming a device isolating process in a method for forming a non-volatile memory device having a gate-all-around structure.

FIG. 18 is a top plan view of a portion of semiconductor substrate including a dummy gate pattern after performing a device isolating process. FIGS. 19A, 20A, 21A, 22A and 23A are cross-sectional views taken along line I-I of FIG. 18, and FIGS. 19B, 20B, 21B, 22B and 23B are cross-sectional views taken along line II-II of FIG. 18.

Figure 19A:
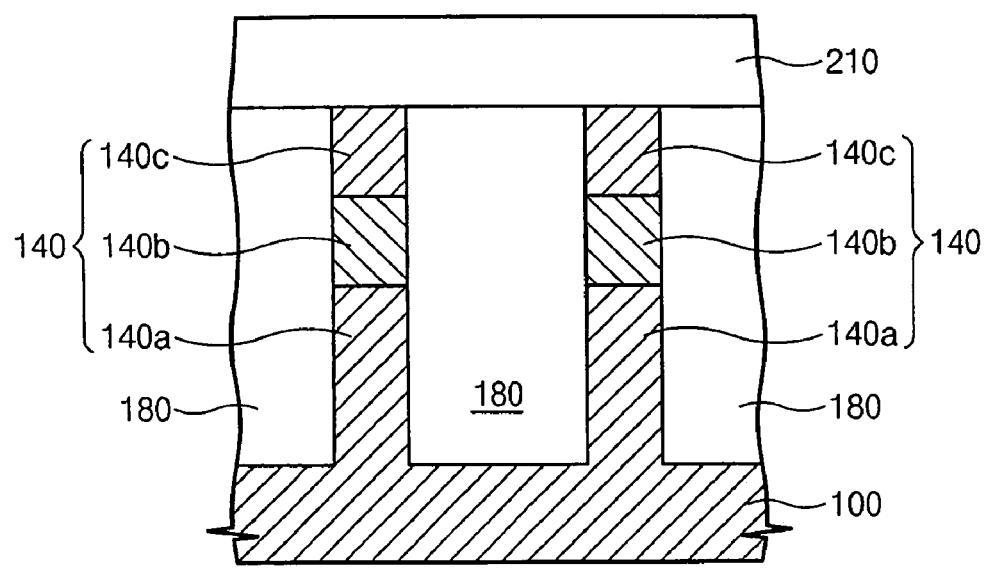
FIGS. 19A, 20A, 21A, 22A and 23A are cross-sectional views taken along line I-I of FIG. 18.
Figure 19B:
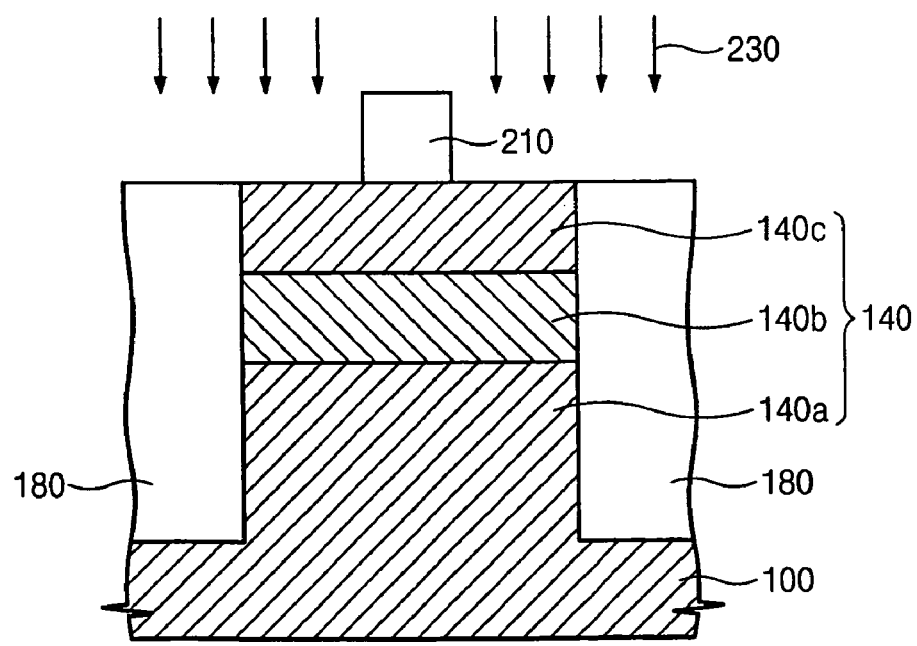
FIGS. 19B, 20B, 21B, 22B and 23B are cross-sectional views taken along line II-II of FIG. 18.

Referring to FIGS. 18, 19A and 19B, a process for forming a dummy gate pattern will be described. First, a semiconductor substrate 100 is prepared. The semiconductor substrate 100 is formed by growing an epitaxial silicon-germanium layer on a bulk silicon substrate and an epitaxial silicon layer on the epitaxial silicon-germanium layer. Methods for forming the epitaxial silicon-germanium layer and the epitaxial silicon layer are well know to those skilled in the art and will not be further described.

The device isolating process is performed to form a semiconductor fin 140 and a device isolating layer 180. The device isolating process may use a trench isolation technique, for example. That is, a capping pattern (not shown) is formed on the semiconductor substrate 100 (referring to FIGS. 2, 3A and 3B) and the semiconductor substrate 100 is etched using the etch mask (referring to FIGS. 4A and 4B). In this case, the etching of semiconductor substrate 100 etches a portion of the epitaxial silicon layer, the epitaxial silicon-germanium layer and the bulk silicon substrate. Therefore, the semiconductor fin 140 includes a first semiconductor pattern 140a, a second semiconductor pattern 140b and a third semiconductor pattern 140c. The first semiconductor pattern 140a (a bulk silicon pattern) is formed from the bulk silicon substrate, the second semiconductor pattern 140b (a silicon-germanium pattern) is formed form the silicon-germanium layer, and the third semiconductor pattern 140c (an epitaxial silicon pattern) is formed from the silicon layer.

Subsequently, an insulating material for forming the device isolating layer is deposited and then a planarization process is performed until a capping pattern is exposed, thereby forming a device isolating layer 180 (with reference to FIGS. 5A and 5B).

A cleaning process is carried out after removing the capping pattern. In this case, the capping pattern is removed to expose a top surface of the semiconductor fin 140. A portion of the device isolating layer at both sides of the semiconductor fin 140 is etched in the cleaning process, thereby making the top surface of the semiconductor fin 140 and the top surface of the device isolation layer 180 have almost the same height.

A dummy gate pattern 210 is formed and an ion implantation process 230 for forming source/drain is carried out using the dummy gate pattern 210 as an ion implantation mask. In this case, the impurity ions may be injected in not only the silicon layer but also the silicon-germanium layer. For instance, the depth of the injected ions is controlled to inject the impurity ions in the silicon-germanium layer. The impurity ions are not injected in the silicon-germanium layer under the dummy gate pattern 210.

If the impurity ions are injected in the silicon-germanium layer, the etch rate is relatively decreased. Therefore, the silicon-germanium pattern including injected impurity ions at both sides of the dummy gate pattern 210 has a relatively lower etch rate than the silicon-germanium pattern without including the impurity ions under the dummy gate pattern 220. Due to the difference in the etch rate, the silicon-germanium pattern under the dummy gate pattern 210 may be selectively removed. As fully described hereinafter, an ion implantation process for source/drain may be carried out in subsequent fabrication steps, that is, after completing the gate electrode.

Figure 20A:
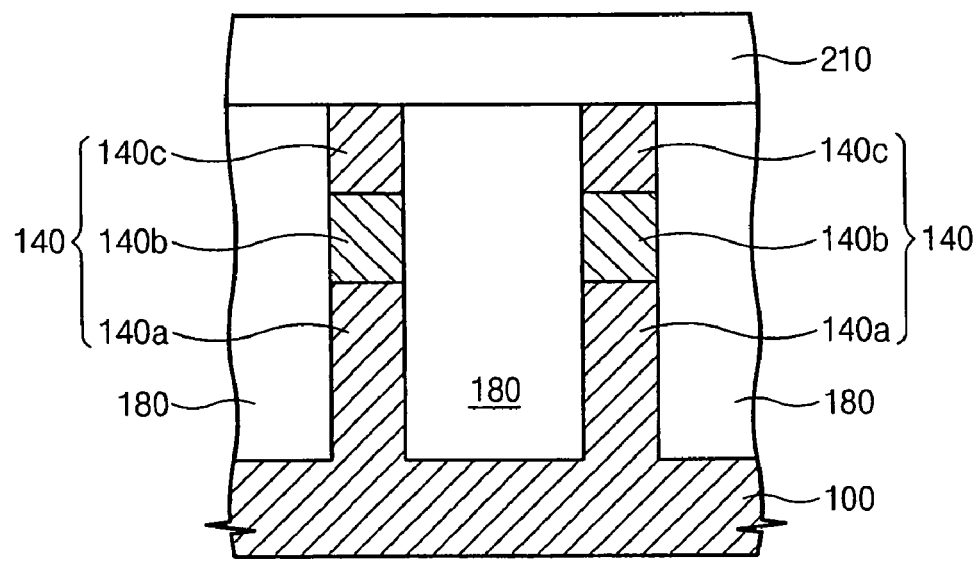
Figure 20B:
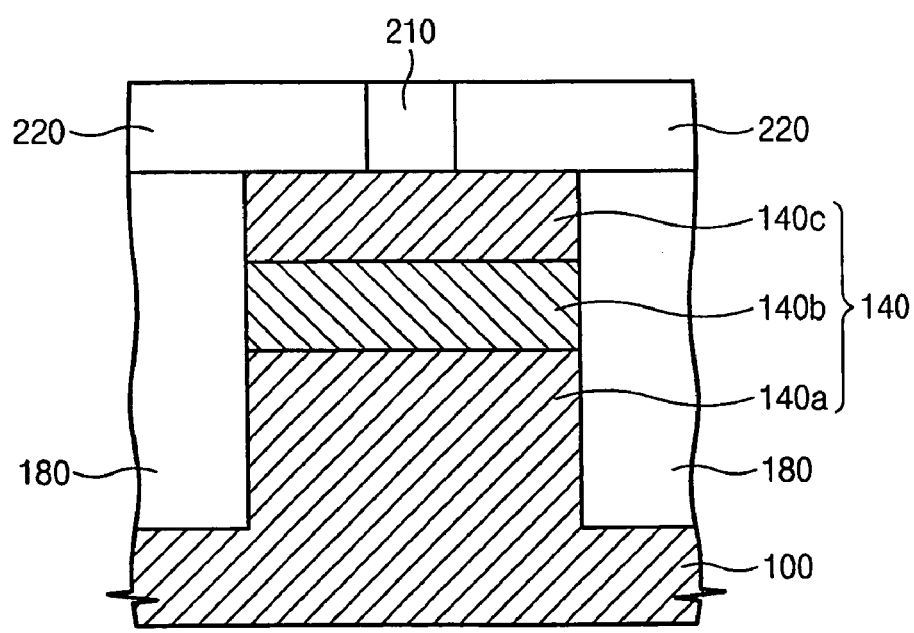

Referring to FIGS. 20A and 20B, a material pattern 220 is formed to surround the dummy gate pattern 210. The material pattern 220 is formed of material having an etch selectivity with respect to the dummy gate pattern 210. For instance, when the dummy gate pattern 210 is formed of oxide, the material pattern 220 is formed of nitride. Alternatively, when the dummy gate pattern is formed of nitride, the material pattern 220 is formed of oxide. The material pattern 220 may be formed through a planarization process after depositing a material layer on the dummy gate pattern 210, the semiconductor fin 140 and the device isolating layer 180. The dummy gate pattern 210 serves as a planarization stop layer in the planarization process.

Figure 21A:
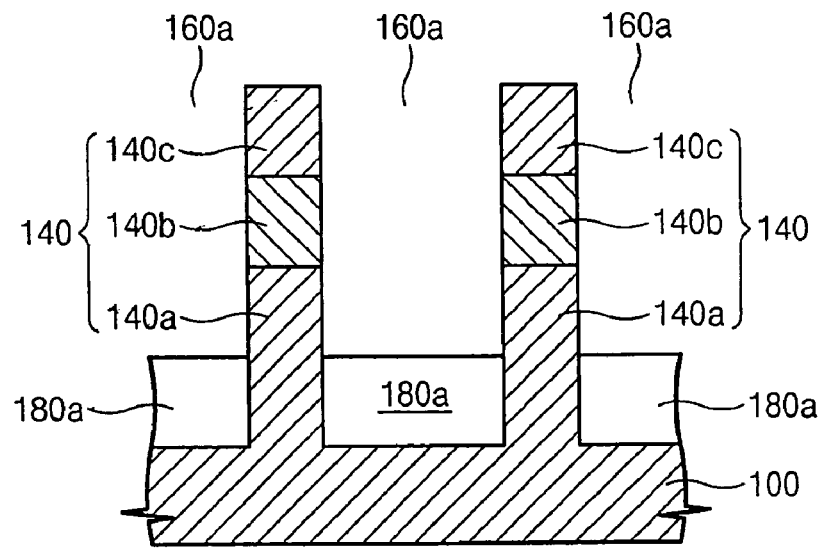
Figure 21B:
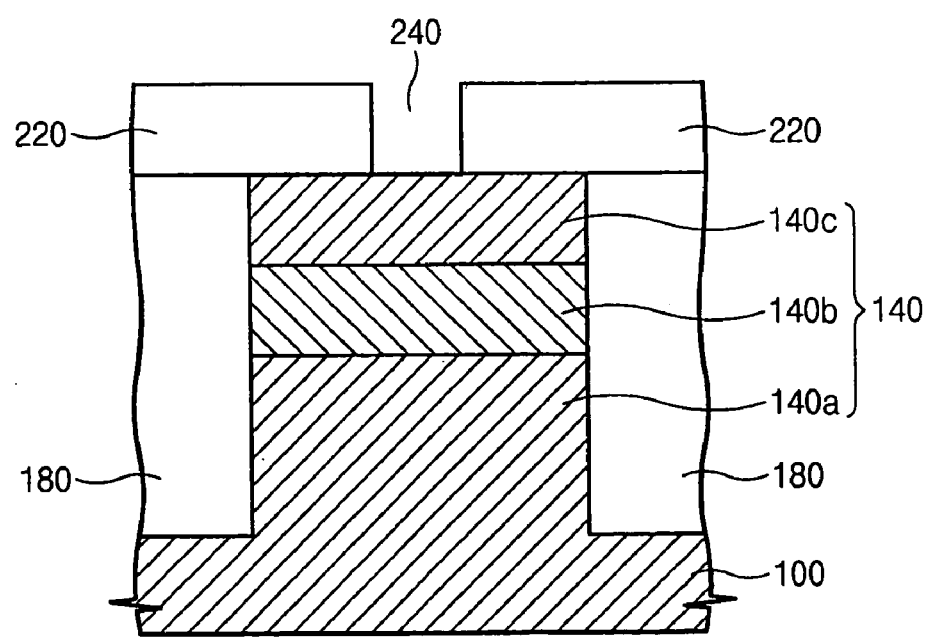

Next, referring to FIGS. 21A and 21B, the dummy gate pattern 210 is selectively etched to expose a top surface of the semiconductor fin 140 and a top surface of the device isolating layer 180. Therefore, a trench 240 corresponding to the dummy gate pattern 210 is defined in the material pattern 220. Subsequently, a portion thickness of the device isolating layer exposed by the trench 240 is selectively removed to expose sides of the semiconductor fin 140. In this case, at least sides of the epitaxial silicon pattern (the third semiconductor pattern) 140c and the silicon-germanium pattern (the second semiconductor pattern) 140b of the semiconductor fin 140 are exposed. A part of sides of the bulk silicon pattern 140a may be exposed.

Figure 22A:
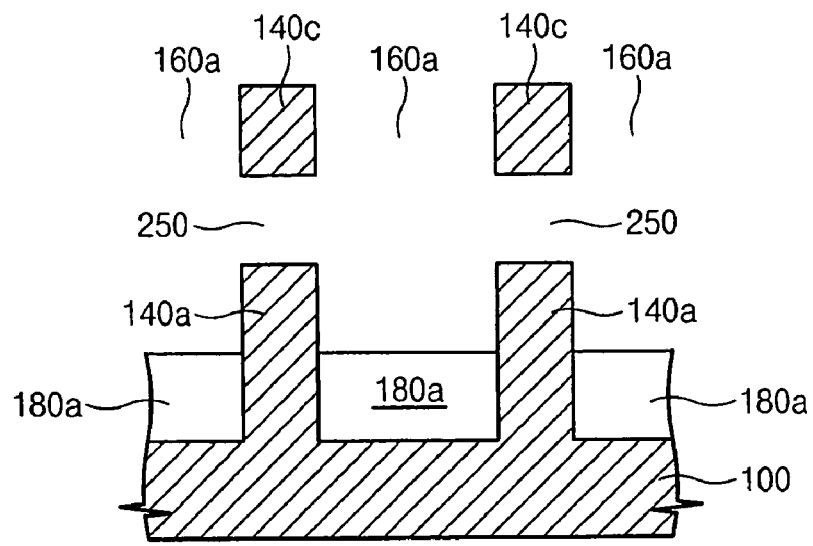
Figure 22B:
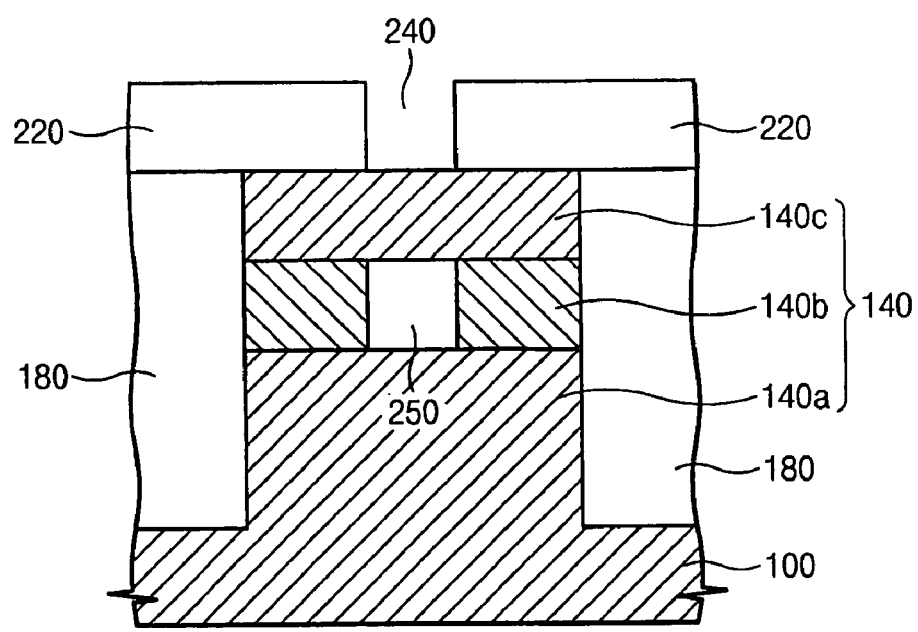

Referring to FIGS. 22A and 22B, the exposed silicon-germanium pattern, that is, a silicon-germanium pattern under a dummy gate pattern (under the trench 240) is removed. The region formed by removing the silicon-germanium pattern is designated 'a space region' or 'a hole'. The space region 250 overlaps the trench 240 under the epitaxial silicon pattern 140c. That is to say, the semiconductor fin 140 includes a hole 250. Impurity ions injected in an ion implantation process for source/drain decreases an etch rate of the silicon-germanium pattern at both sides of the dummy gate pattern (at both sides of the trench 240). Thus, only the silicon-germanium pattern under the trench where the impurity ions are not injected may be selectively removed. That is, the silicon-germanium pattern under the source/drain region is not removed, and the source/drain region is electrically connected to a semiconductor silicon pattern 140a through the silicon-germanium pattern. The trench 240, the space region 250 and the residual trench 160a expose entire outer surfaces of the third semiconductor pattern (the epitaxial silicon pattern) and a top surface and a portion of sides of the bulk silicon pattern 140a under the trench 240 are also exposed.

The selective removal of the silicon-germanium pattern 140b under the hole 250 may be carried out using an etch solution including pure water, phosphoric acid, acetic acid and nitric acid.

The silicon-germanium pattern 140b may be removed entirely if the ion implantation process for forming source/drain is not performed after the forming of the dummy gate pattern. However, if the process time is controlled, the etch amount of silicon-germanium pattern toward a side direction removes only the silicon-germanium pattern under the trench 240.

Next, the ion implantation process for forming the channel is carried out. In this case, the material pattern 220 serves as an ion implantation mask.

Figure 23A:
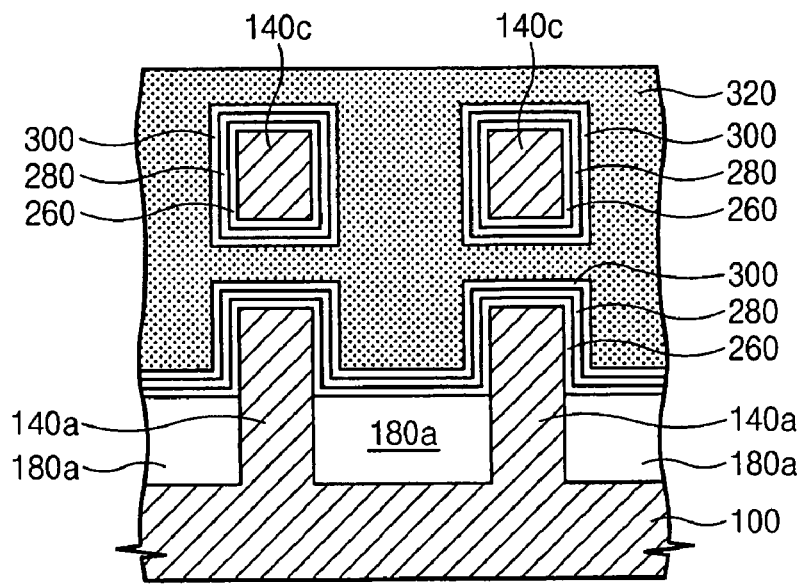
Figure 23B:
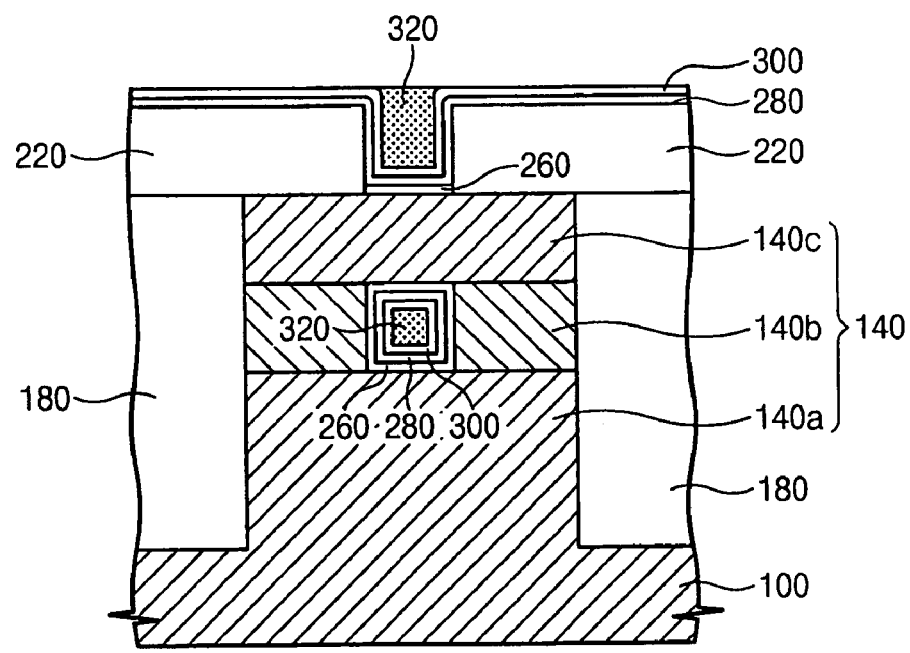

Referring to FIGS. 23A and 23B, a tunneling oxide layer 260, a charge storage layer 280 and a block insulating layer 300 are sequentially stacked. Subsequently, a gate electrode layer is formed and then a planarization process is carried out to form a gate electrode 320.

In a method for forming the above nonvolatile memory device having a gate-all-around structure, if the ion implantation process for forming source/drain is not performed after forming the dummy gate pattern, the ion implantation process for forming the source/drain is carried out after the forming of the gate electrode 320. That is, after the gate electrode 320 is formed, the material pattern 220 at both sides thereof is removed and impurity ions are injected to form the source/drain.

In the method for forming the above nonvolatile memory device having a gate-all-around structure, when the charge storage layer 280 is formed of conductive material, the charge storage layer is formed and then the photolithographic process is carried out to electrically isolate neighboring charge storage layers on the semiconductor fin to each other electrically.

In addition, in the method for forming the above nonvolatile memory device having the gate-all-around structure, the dummy gate pattern may not be formed when the ion implantation process for source/drain is performed after the gate electrode is formed.

That is, a device isolating layer is performed to form a semiconductor fin 140 and a device isolating layer 180, a capping pattern is removed, and a cleaning process is applied. Then, a material pattern 220 including a trench 240 may be performed in the same method as the above method for forming the nonvolatile memory device having the double gate structure. That is, a material layer is formed on a top surface of the semiconductor fin 140 and a top surface of the device isolating layer 180 and a photolithographic process is performed to pattern the material layer, thereby forming the material pattern 220 having the trench 240.

In addition, the dummy gate pattern may be formed by a portion of the capping pattern and the device isolating pattern. That is, the semiconductor substrate is etched using the capping pattern and insulating material is deposited to form a device isolating layer. A photolithographic process is applied to etch the capping pattern and the device isolating layer, thereby forming a dummy gate pattern that crosses over the semiconductor fin. In this case, the dummy gate pattern may be comprised of a portion of capping pattern and device isolating layer.

As illustrated in FIGS. 23A and 23B, a gate electrode 320 of nonvolatile memory device having the gate-all-around structure surrounds not only sides of the epitaxial silicon pattern 140c serving as a channel but also a top surface and a bottom surface of an epitaxial silicon pattern 140c and a top surface and a portion of sides of a bulk silicon pattern 140a.

The nonvolatile memory device having the gate-all-around structure according to the present invention includes a silicon fin 140 that is formed by stacking the bulk silicon pattern 140a, a silicon-germanium pattern 140b and the epitaxial silicon pattern 140c. The silicon germanium pattern 140c has a hole. Sides of the hole are defined by a silicon-germanium pattern 140b, a top surface of the hole is defined by the epitaxial silicon pattern 140c, and a bottom of the hole is defined by the bulk silicon pattern 140a. The gate electrode 320 surrounds outer surfaces of the epitaxial silicon pattern 140c through the hole. A tunneling insulating layer 260, a charge storage layer 280 and a blocking insulating layer 300 are interposed between the gate electrode 320 and the semiconductor fin 140.

Also, in the above method for forming the nonvolatile memory device having the gate-all-around structure, the charge storage layer 280 is formed and an etch back process is performed to remove the charge storage layer that is formed on the top surface of the epitaxial silicon pattern 140c. In this case, the block insulating layer 300 may fill the entire space region 250. That is, the gate electrode 320 is not formed in the space region 250.

Figure 24A:
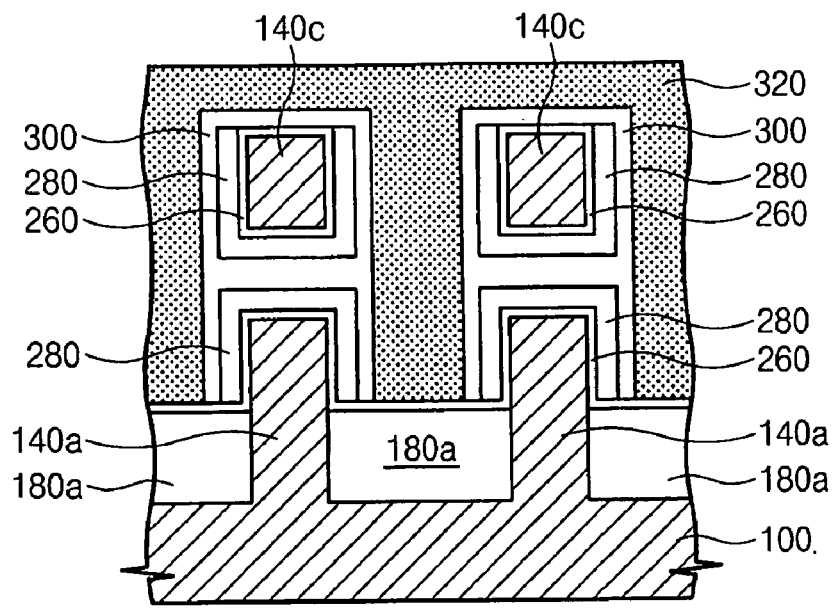
FIGS. 24A and 24B are schematic cross-sectional views of a nonvolatile memory device according to an exemplary embodiment of the present invention.
Figure 24B:
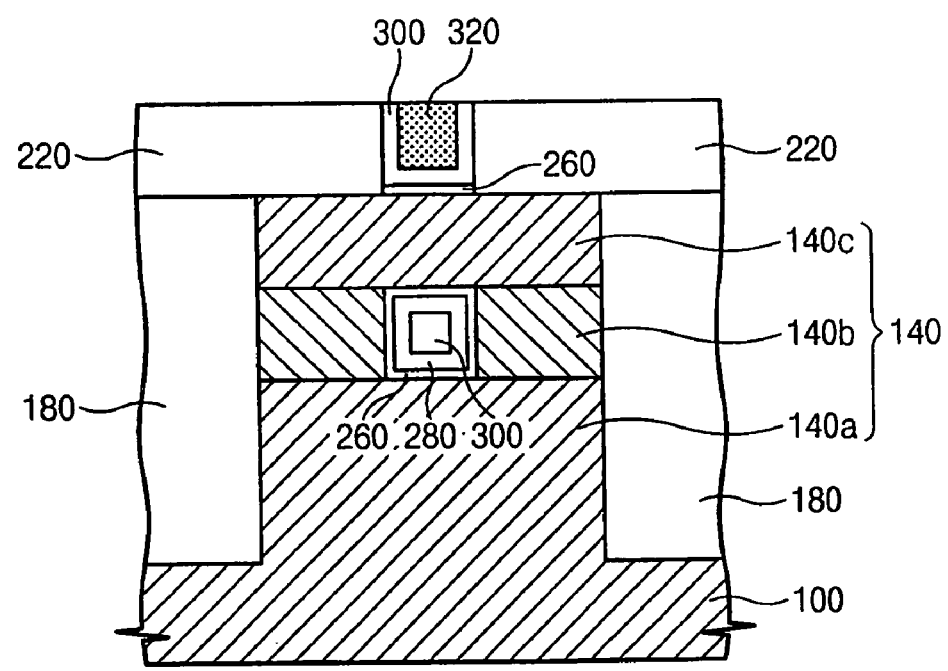

Therefore, as illustrated in FIG. 24A and FIG. 24B, the tunneling insulating layer 260, the blocking insulating layer 300 and the gate electrode 320 are sequentially stacked to construct the same structure as that of the conventional transistor. Also, a tunneling insulating layer, a charge storage layer and a block insulating layer are formed on the sides and the bottom surface of the epitaxial silicon pattern 140c, thereby constructing the same structure as that of the nonvolatile memory.

In the above method for forming the nonvolatile memory device having a gate-all-around structure, the semiconductor substrate is formed by stacking an epitaxial silicon-germanium layer and an epitaxial silicon layer on a bulk silicon substrate once. However, in one embodiment, the epitaxial silicon-germanium layer and the epitaxial silicon layer are stacked on the bulk silicon substrate two or more times. In this case, a multi channel is formed. The space region 250 is formed as many as the number of stacked silicon-germanium layers.

Referring to FIGS. 25 through 28, a method for forming a nonvolatile memory device having a double gate-all-around structure is described.

Figure 25:
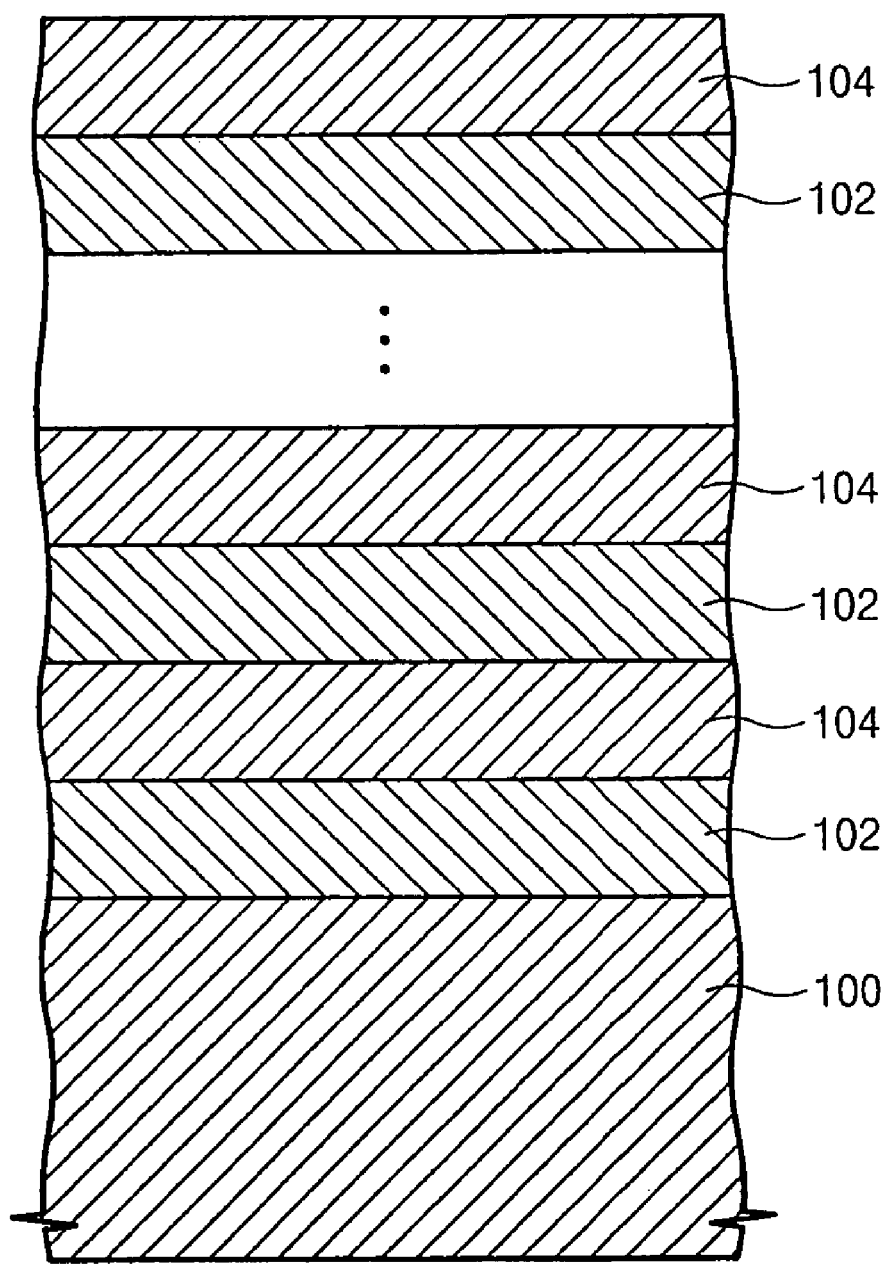
FIGS. 25 through 28 are cross-sectional views illustrating a method for forming a nonvolatile memory device having a multi channel gate-all-around structure using a bulk silicon substrate.

First, referring to FIG. 25, a silicon-germanium layer 102 and a silicon layer 104 are grown from a bulk silicon substrate 100 twice or more times to prepare a semiconductor substrate.

Figure 26:
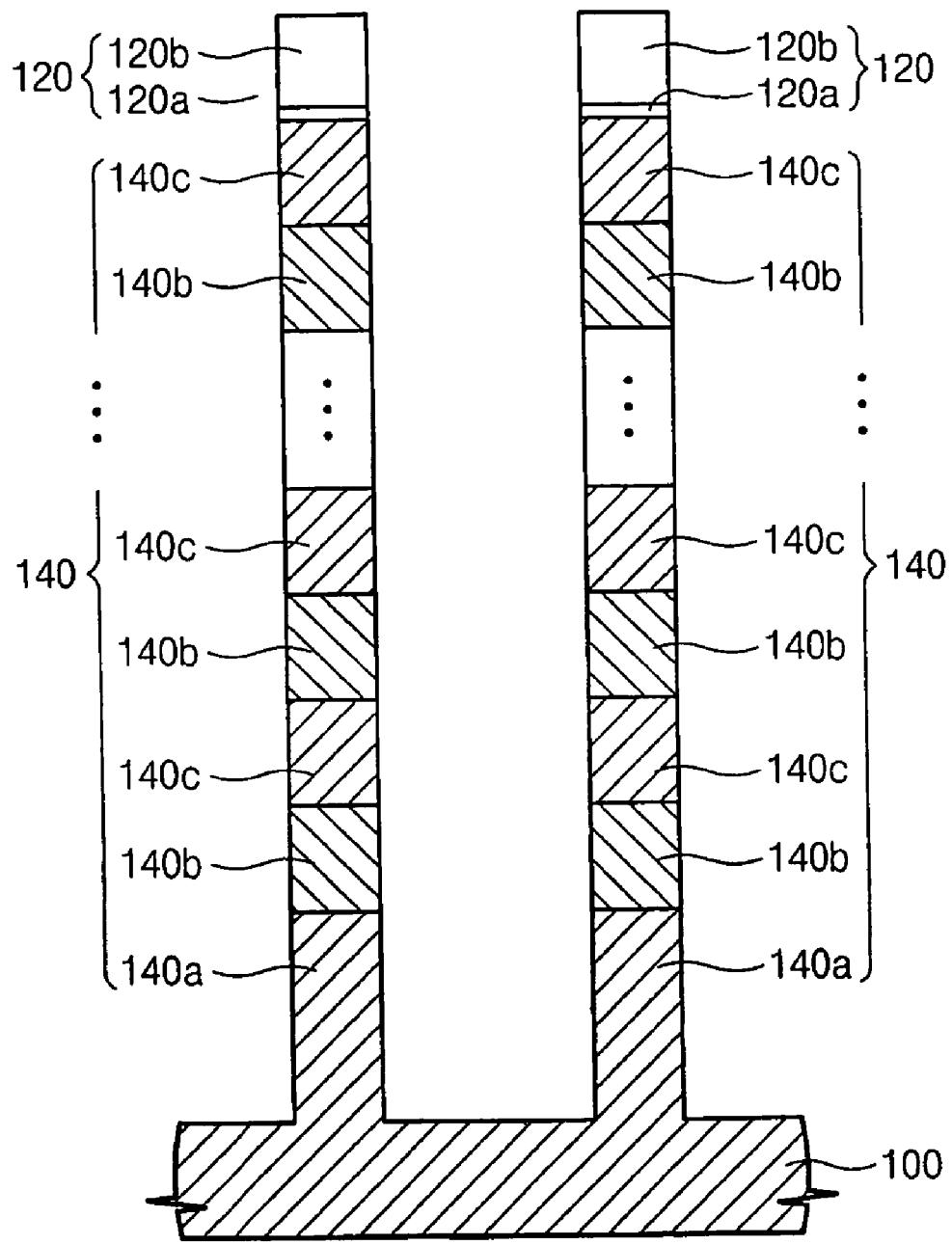

Referring to FIG. 26, a capping pattern 120 is formed on an uppermost layer of the semiconductor substrate (i.e. a silicon layer) 104 and then an etch process is performed to form a semiconductor fin 140. The semiconductor fin 140 comprises a first semiconductor pattern (a bulk silicon pattern) 140*a* formed form the bulk silicon substrate 100, a second semiconductor pattern (a silicon-germanium pattern) 140*b* that is stacked alternately two or more times with two or more third patterns (an epitaxial silicon pattern) 140*c*.

Figure 27:
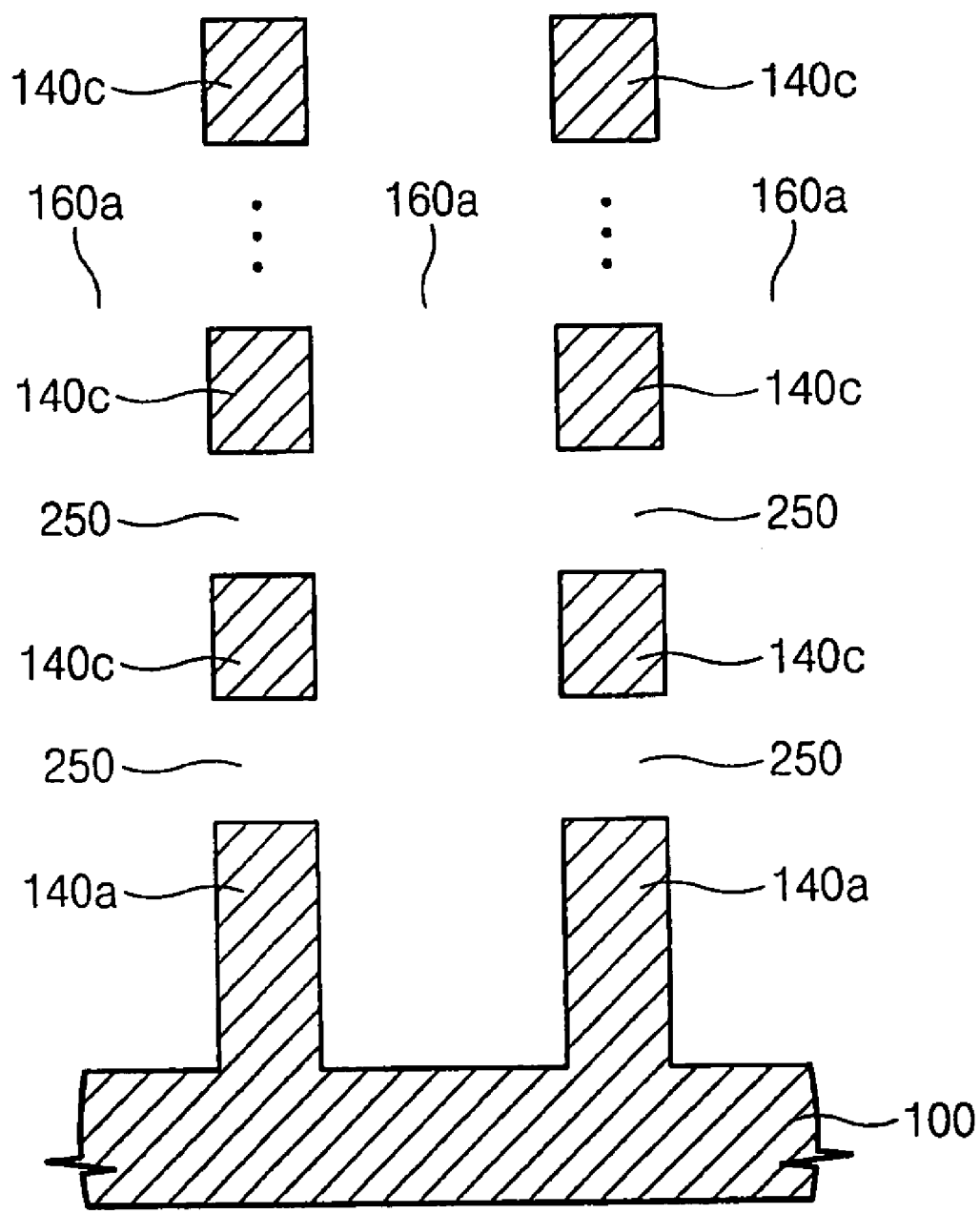

Next, a device isolating process, a dummy gate process, an ion implantation process for source/drain, a material pattern forming process, etc. are carried out in the same as method as described above. Then, as illustrated in FIG. 27, a portion of the device isolating layer is removed to expose a semiconductor fin 140. Therefore, a plurality of space regions 250 are formed to expose outer surfaces of the epitaxial silicon patterns 140*c*.

Figure 28:
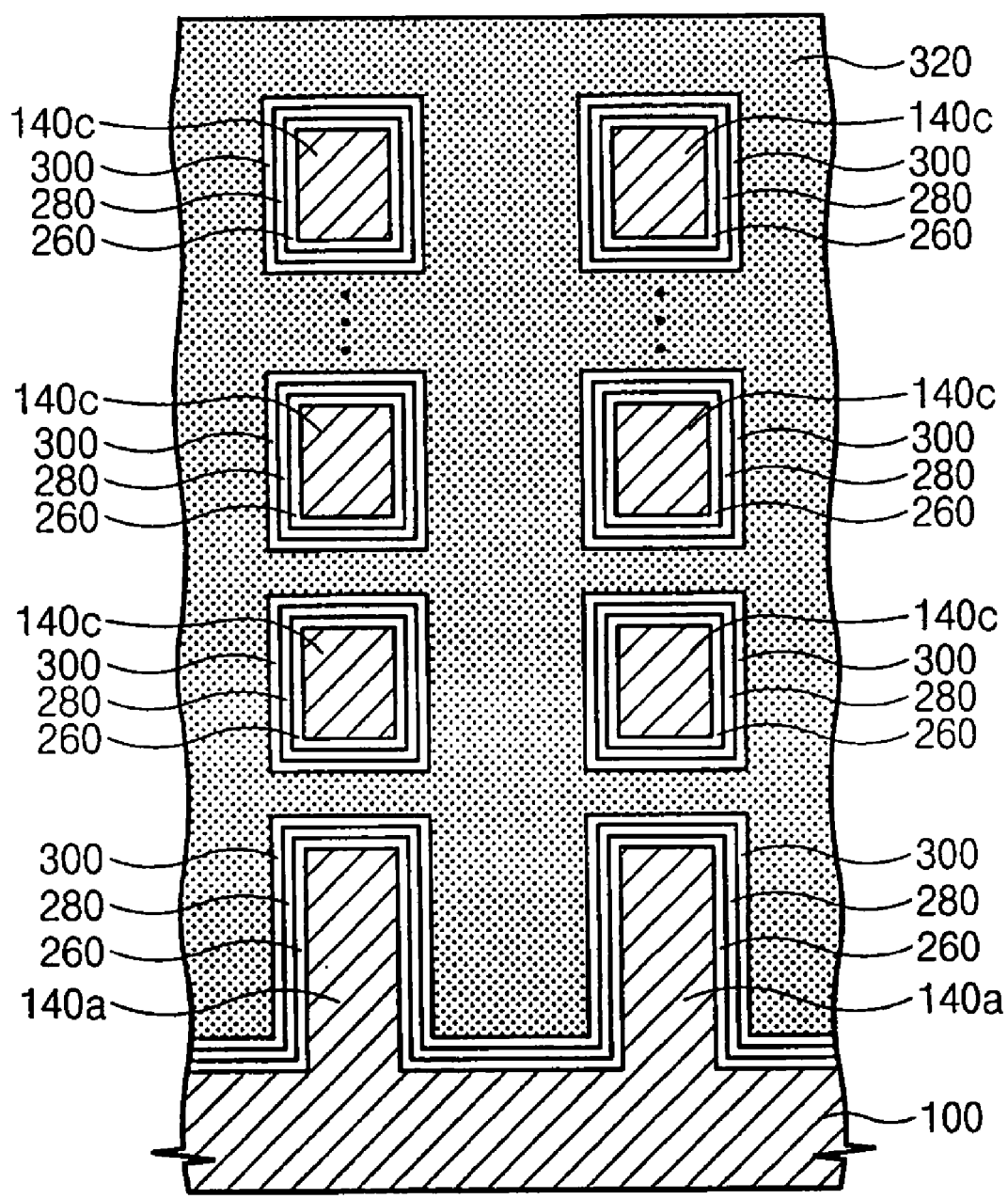

Referring to FIG. 28, a tunneling insulating layer 260, a charge storage layer 280, a blocking insulating layer 300, and a gate electrode 320 are formed after the channel ion implantation process is carried out.

Figure 29:
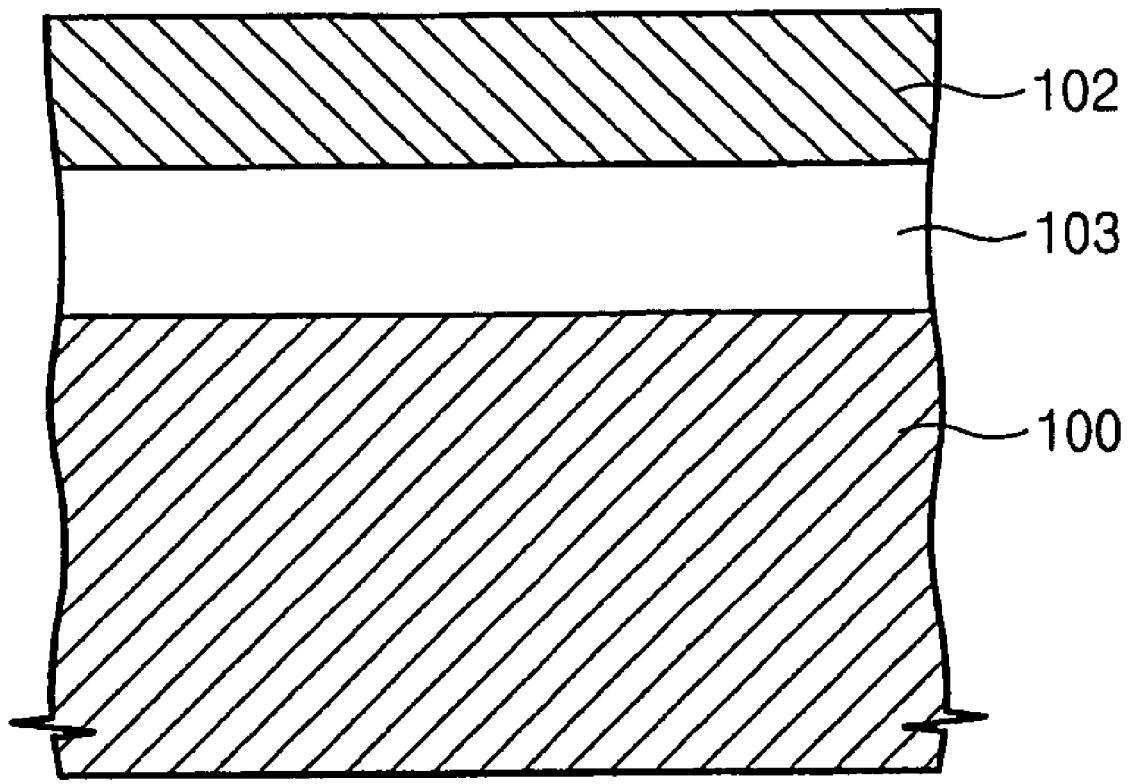

Referring to FIG. 29, an SOI substrate 100 is prepared, which comprises a silicon substrate 100, a buried insulating layer 103 and a silicon layer 102. If a silicon-germanium layer is formed on the buried insulating layer 103 instead of the silicon layer 102, an SGOI substrate may be formed. If a germanium layer is formed on the buried insulating layer 103, a GOI substrate may be formed.

Figure 30A:
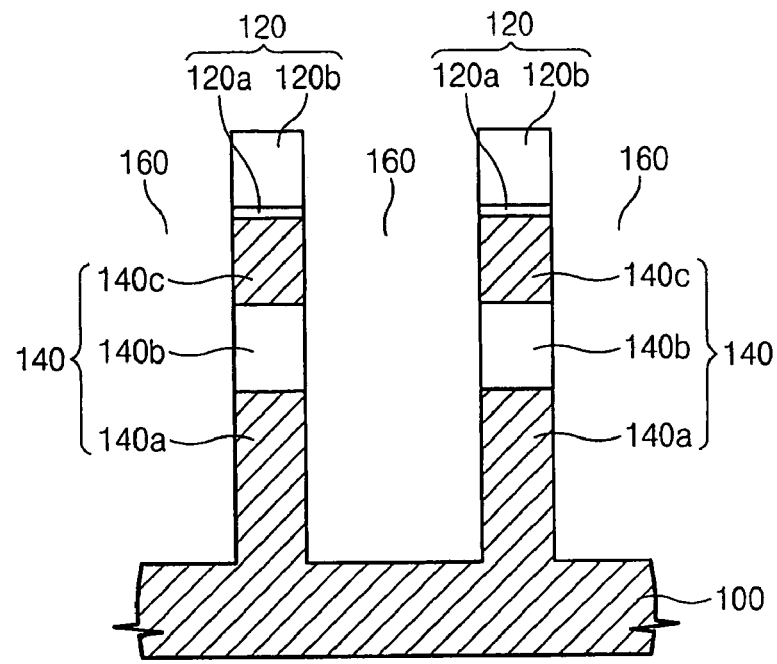
Figure 30B:
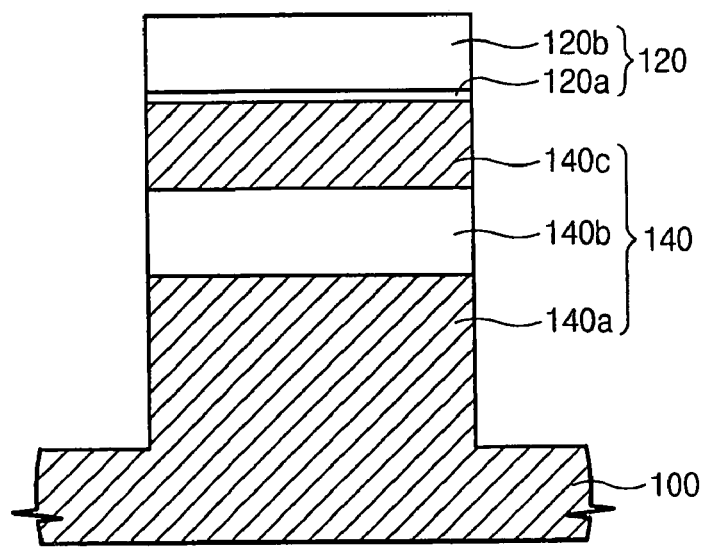

Referring to FIGS. 30A and 30B, a capping pattern 120 is formed on a silicon layer 102 and the exposed SOI substrate 100 is etched to form a semiconductor fin 140. In this case, the semiconductor fin 140 comprises a first semiconductor pattern 140*a* formed from the silicon substrate 100, a third semiconductor pattern formed from the silicon layer 102 and a second pattern (a buried insulating layer) 140*b* that insulates the two semiconductor patterns electrically. The semiconductor substrate 100 may not be etched.

Figure 31A:
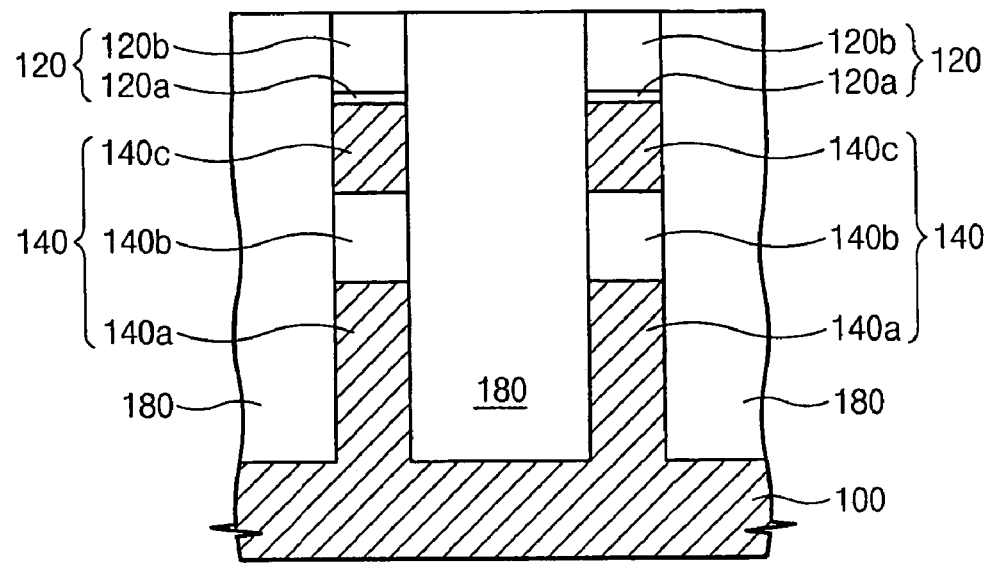
Figure 31B:
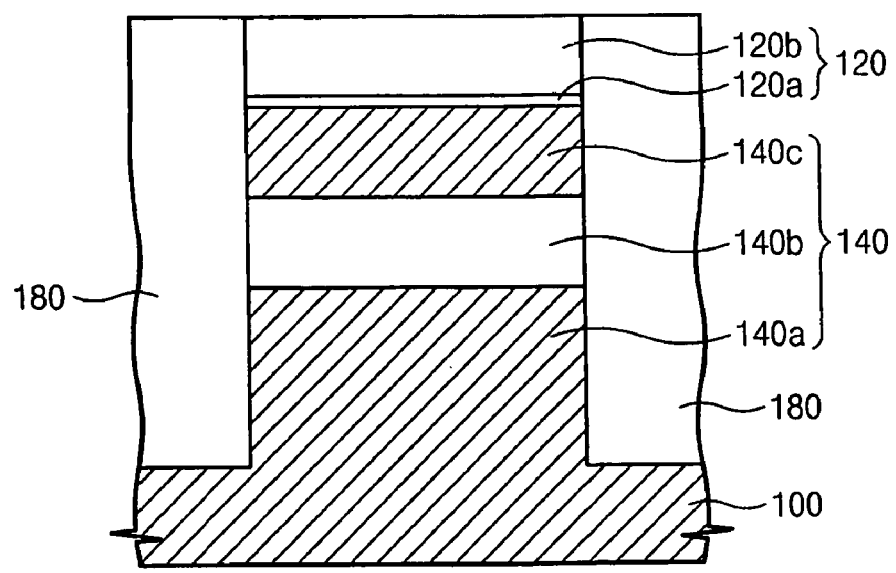

Next, referring to FIGS. 31A and 31B, an insulating material is deposited to fill the trench 160 and a planarization process is performed until the capping pattern 120 is exposed to form a device isolating layer 180.

Figure 32A:
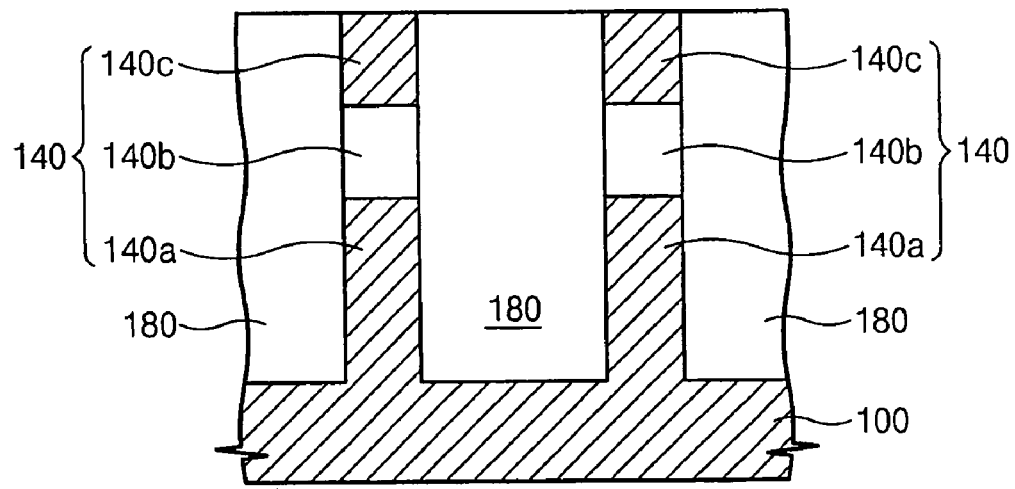
Figure 32B:
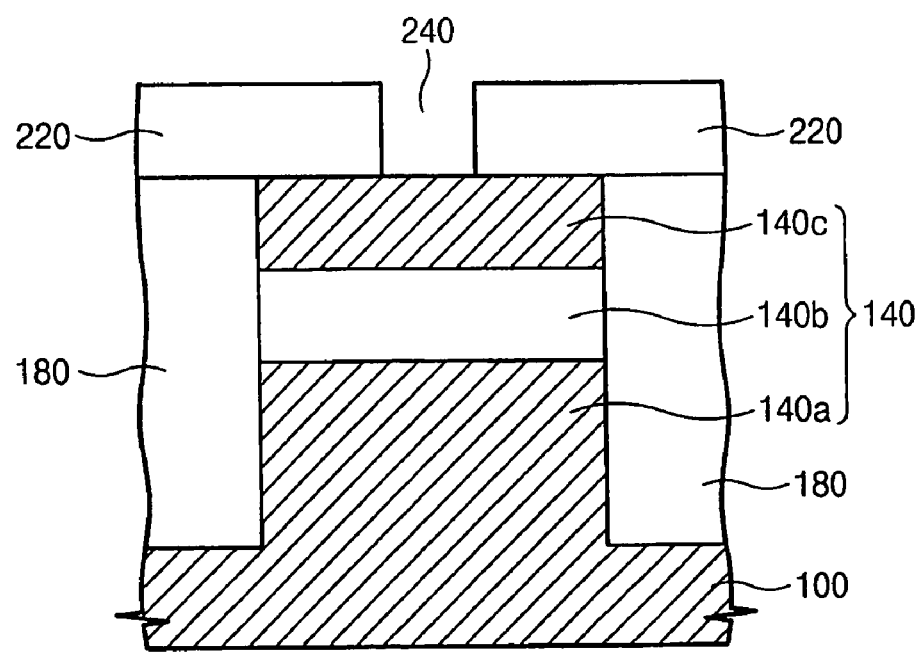

Next, referring to FIGS. 32A and 32B, the capping pattern 120 is removed, the cleaning process is performed and a material pattern 220 is formed. The material pattern 220 includes a trench 240 for defining a gate electrode.

Figure 33A:
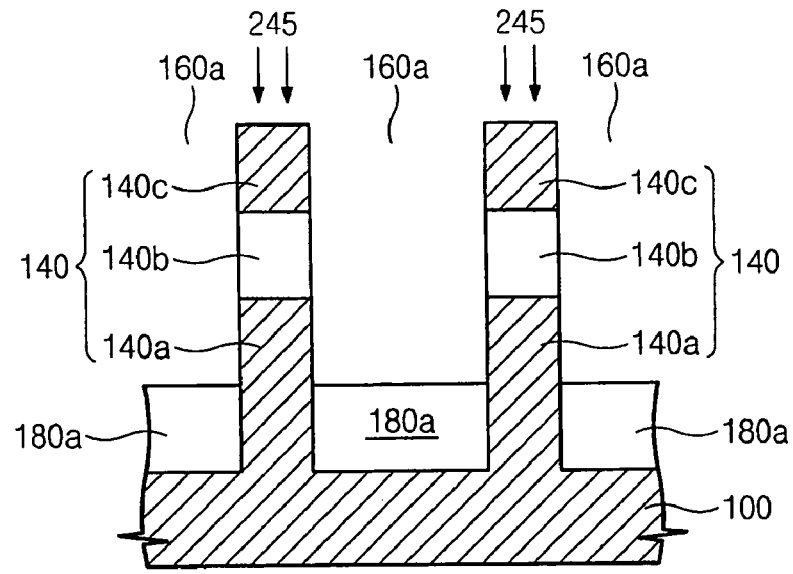
Figure 33B:
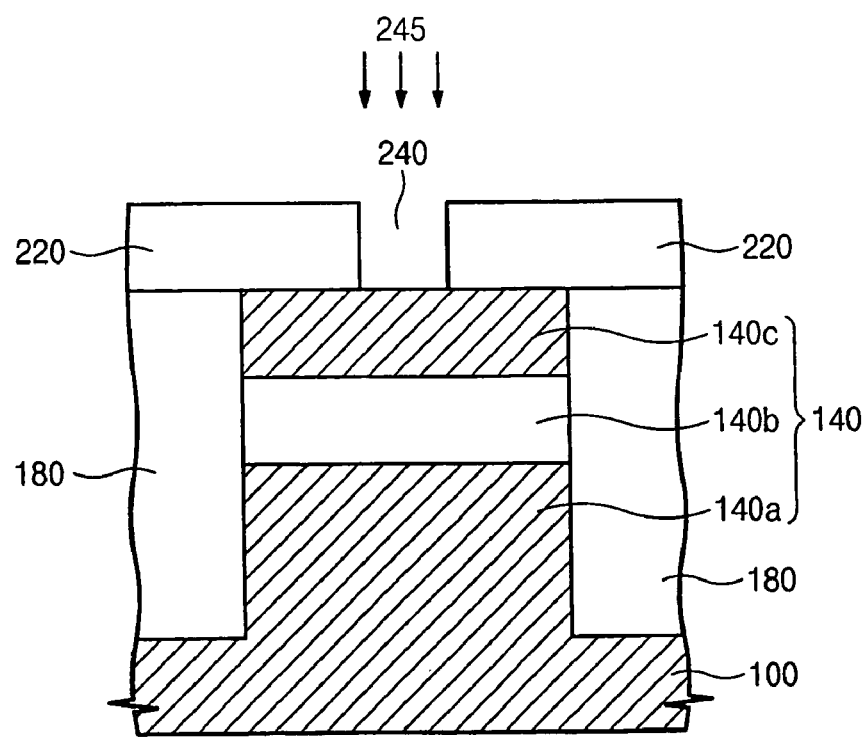

Referring to FIGS. 33A and 33B, a portion of device isolating layer exposed by the trench 240 is etched to expose sides of the third semiconductor pattern 140*c*, the second pattern 140*b* and the first semiconductor pattern 140*a*.

Subsequently, impurity ions 245 for forming a channel are injected in the third semiconductor pattern 140*c*. The impurity ions may be injected also in the second pattern (the buried insulating pattern) 140*b*. The buried insulating layer including the impurity ions has an etch rate higher than that of the insulting layer. That is, the etch rate of the burred insulating pattern under the trench 240 increases in comparison with the buried insulating pattern at both sides of the trench because the impurity ions are injected. Therefore, only the buried insulating patter under the trench 240 may be selectively removed in the subsequent process.

Figure 34A:
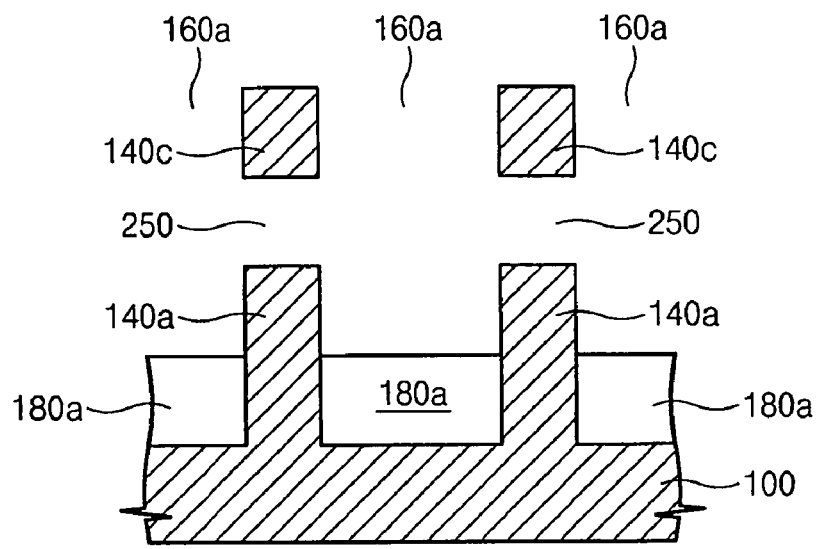
Figure 34B:
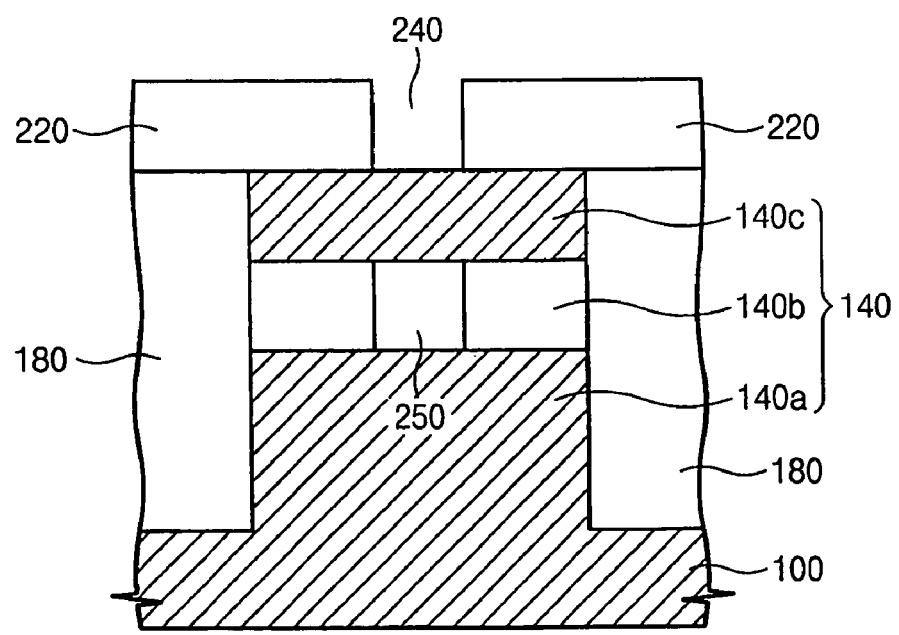

Referring to FIGS. 34A and 34B, the exposed buried insulating pattern 140*b* are selectively removed and a space region 250 is formed aligned to the trench 240 under the third semiconductor pattern 140*c*. Thus, entire outer surfaces of the third semiconductor pattern 140*c* under the trench 240 are exposed.

The impurity ions 245 implantation process for forming a channel may be carried out after removing the buried insulating pattern 140*b*. In this case, not only the buried insulating pattern under the trench 240 but also the buried insulating pattern at both sides thereof may be removed.

Figure 35A:
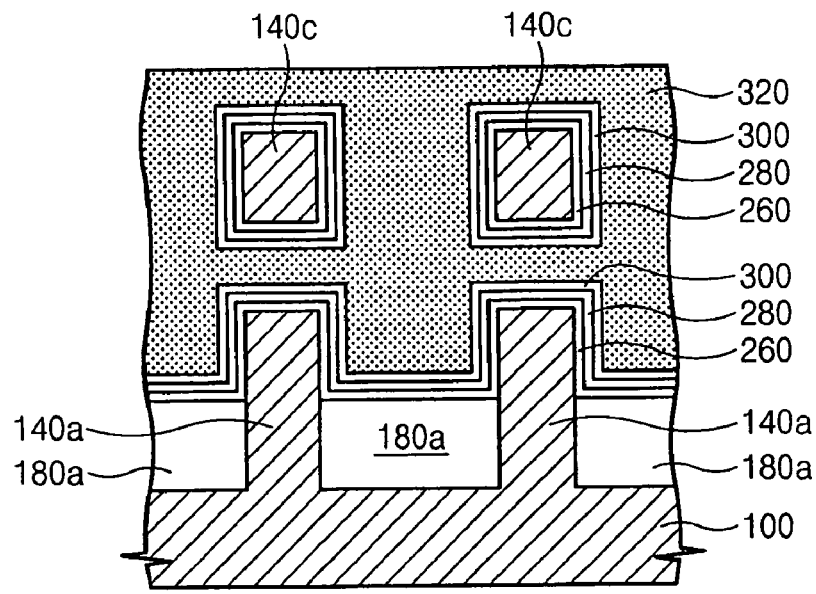
Figure 35B:
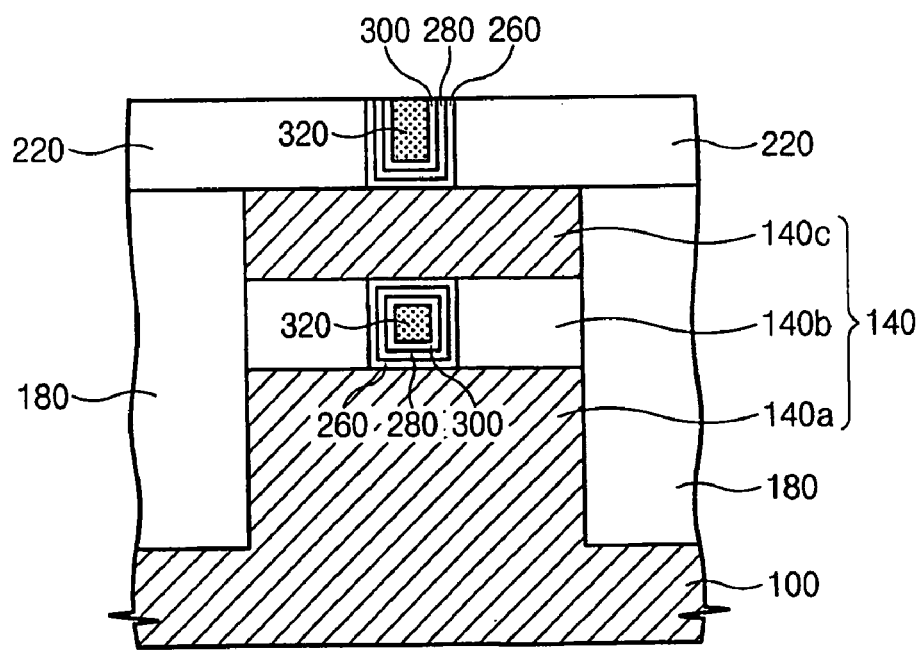

Referring to FIGS. 35A and 35B, a tunneling insulating layer 260, a charge storage layer 280, a block insulating layer 300 an a gate electrode 320 are formed. Source/drain is formed in a subsequent process.

In the method for forming the nonvolatile memory device having the gate-all-around structure using the above SOI substrate, a semiconductor substrate may be formed by stacking a silicon-germanium layer and a silicon layer alternately twice times. Alternatively, a silicon layer and a silicon-germanium layer are alternately staked on the buried insulating layer two or more times, thereby forming a semiconductor substrate. In this case, the method for forming the multi channel gate-all-around structure using the SOI substrate is identical to the method for forming the nonvolatile semiconductor memory device having the multi channel gate-all-around structure using the above bulk silicon substrate except the buried insulating layer that intervenes between the silicon-germanium and the silicon substrate.

A semiconductor substrate including a buried insulating layer between the bulk silicon substrate 100 and the lowermost silicon-germanium layer 102 is prepared (referring to FIG. 25). A capping pattern 120 is formed on an uppermost buried insulating layer. Then, the silicon layer, the silicon-germanium layer, the buried oxide layer and a portion of the bulk silicon substrate are etched to form a semiconductor fin. In this case, the buried oxide layer and a portion of the silicon substrate may not be etched.

The above fabrication steps are performed as a sequent process with reference to FIGS. 27 and 28.

According to the present invention, the gate electrode is formed using a damascene process to reduce etch damage of the semiconductor fin and the tunneling insulating layer.

Impurity ions are injected in not only a channel region but also a second semiconductor pattern or a second insulating pattern in a channel ion implantation process or a source/drain ion implantation process, thereby forming a space region aligned under a trench.

Although the present invention has been described in connection with the embodiment of the present invention illustrated in the accompanying drawings, it is not limited thereto. It will be apparent to those skilled in the art that various substitution, modifications and changes may be thereto without departing from the scope and spirit of the invention.

What is claimed is:

1. A method for forming a semiconductor memory device comprising:
    forming a semiconductor fin that is connected to a semiconductor substrate and includes a hole;
    forming a tunneling insulating layer on both sides and a top surface of the semiconductor fin over the hole, sides of the semiconductor fin under the hole and inner surfaces of the semiconductor fin that are defined by the hole;
    forming a charge storage layer on the tunneling insulating layer;
    forming a blocking insulating layer on the charge storage layer; and
    forming a gate electrode layer on the blocking insulating layer.

2. The method of claim 1, wherein forming the semiconductor fin that is connected to the semiconductor substrate and includes the hole comprises:
    forming a second semiconductor layer and a third semiconductor layer that are alternately stacked on the semiconductor substrate one or more times;
    etching the second semiconductor layer and the third semiconductor layer that are stacked alternately and a thickness of the semiconductor substrate to form a semiconductor fin comprising a first semiconductor pattern formed from the semiconductor substrate, a second semiconductor pattern formed from the second semiconductor layer and the third semiconductor pattern formed from the third semiconductor layer;

forming a device isolating layer surrounding sides of the semiconductor fin;

forming a material pattern including a trench exposing the semiconductor fin and a portion of the device isolating layer, on the semiconductor fin and the device isolation layer;

etching the device isolating layer exposed by the trench until at least the first semiconductor pattern is exposed; and removing the second semiconductor pattern exposed under the trench to form a hole in the second semiconductor pattern, aligned under the trench.

3. The method of claim 1, wherein the charge storage layer is formed of at least one of nano-crystal, quantum dot, silicon, silicon-germanium, a metal layer and a nitride layer.

4. The method of claim 2, wherein the charge storage layer is formed of at least one of nano-crystal, quantum dot, silicon, silicon-germanium, a metal layer and a nitride layer.

5. The method of claim 2, wherein the semiconductor substrate and the third semiconductor layer are the same material, and the second semiconductor layer has an etch selectivity with respect to the semiconductor substrate and the third semiconductor layer.

6. The method of claim 2, wherein the semiconductor substrate and the third semiconductor layer are the same material, and the second semiconductor layer has an etch selectivity with respect to the semiconductor substrate and the third semiconductor layer.

7. The method of claim 2, further comprising applying an ion implantation process for a channel in the third semiconductor pattern through the trench using the material pattern as an ion implantation mask.

8. The method of claim 2, wherein the forming of the material pattern including the trench exposing the semiconductor fin and a portion of the device isolating layer on the semiconductor fin and the device isolating layer comprises:

forming a dummy gate line crossing over the semiconductor fin and the device isolating layer;

forming the material pattern surrounding sides of the dummy gate line;

forming the trench corresponding to the dummy gate line by removing the dummy gate line.

9. The method of claim 8, further comprising after the forming of the dummy gate line, injecting impurity ions for source/drain in the third semiconductor pattern and the second semiconductor pattern at both sides of the dummy gate line, wherein the second semiconductor pattern at both sides of the dummy gate line, injected with the impurity ions, has relatively lower etch rate than the second semiconductor pattern under the trench.

10. The method of claim 9, further comprising after the forming of the hole, applying an ion implantation process for a channel to the third semiconductor pattern through the trench using the material pattern as an ion implantation mask to injecting the impurity ions.

11. The method of claim 2, wherein the device isolating layer exposed by the trench is etched until at least the first semiconductor pattern is exposed and applying a thermal oxidation process or a thermal treatment process in a hydrogen ambient so as to round a sharp edge of the semiconductor fin before the forming of the tunneling insulating layer.

12. The method of claim 7, wherein the second semiconductor layer and the third semiconductor layer are stacked once, and further comprising removing the charge storage layer on a top surface of the third semiconductor pattern by an etch back process after the forming of the charge storage layer.

13. The method of claim 8, wherein the second semiconductor layer and the third semiconductor layer are stacked once, and further comprising removing the charge storage layer on a top surface of the third semiconductor pattern by an etch back process after the forming of the charge storage layer.

14. The method of claim 9, wherein the second semiconductor layer and the third semiconductor layer are stacked once, and further comprising removing the charge storage layer on a top surface of the third semiconductor pattern by an etch back process after the forming of the charge storage layer.

15. The method of claim 10, wherein the second semiconductor layer and the third semiconductor layer are stacked once, and further comprising removing the charge storage layer on a top surface of the third semiconductor pattern by an etch back process after the forming of the charge storage layer.

16. The method of claim 11, wherein the second semiconductor layer and the third semiconductor layer are stacked once, and further comprising removing the charge storage layer on a top surface of the third semiconductor pattern by an etch back process after the forming of the charge storage layer.

17. The method of claim 2, further comprising:

forming a buried oxide layer before the stacking of the second semiconductor layer and the third semiconductor layer alternately on the semiconductor substrate one or more times; and injecting impurity ions for source/drain in the third semiconductor pattern and the second semiconductor pattern under the hole, wherein the dummy gate pattern including the injected impurity ions at both sides of the second semiconductor pattern has a relatively lower etch rate than the second semiconductor pattern under the trench.

18. The method of claim 17, further comprising injecting impurity ions by applying the ion implantation process for a channel to the third semiconductor pattern through the trench using the material pattern as an ion implantation mask after the forming of the hole.

19. The method of claim 1, wherein forming the semiconductor fin including a hole in the semiconductor substrate comprises:

forming a second insulating layer and a third semiconductor layer on the semiconductor substrate;

etching the third semiconductor layer, the second insulating layer and a thickness of the semiconductor substrate to form a semiconductor fin comprising a first semiconductor pattern formed from the semiconductor substrate, a second insulating pattern formed from the second insulating layer and a third semiconductor pattern formed from the third semiconductor layer;

forming a device isolating layer for surrounding sides of the semiconductor fin;

forming a material pattern including a trench exposing the semiconductor fin and a portion of the device isolating layer, on the semiconductor fin and the device isolating layer;

etching the device isolating layer exposed by the trench until at least the first semiconductor pattern is exposed; and removing the second insulating pattern exposed under the trench to form a hole placed in the second insulating pattern, aligned under the trench.

20. The method of claim 19, further comprising injecting impurity ions by applying an ion implantation process for a channel to the third semiconductor pattern and the second insulating pattern through the trench after the forming of the material pattern including the trench, wherein the second insulating pattern including the injected impurity ions under the trench has relatively higher etch rate than the second insulating pattern at both sides of the trench.

21. The method of claim 20, further comprising performing an ion implantation process for forming source/drain after the forming of the gate electrode.

22. The method of claim 19, further comprising performing a thermal oxidation process and a thermal treatment process in an hydrogen ambient to round a sharp edge of the semiconductor fin after the etching of the device isolating layer exposed by the trench until the first semiconductor pattern is exposed at least and before the forming of the tunnel insulating layer.

23. The method of claim 19, further comprising removing the charge storage layer on the top surface of the third semiconductor surface by performing the etch back process after the charge storage layer is formed.

* * * * *